United States Patent
Blades

(10) Patent No.: US 7,057,401 B2
(45) Date of Patent: Jun. 6, 2006

(54) ELECTRICAL WIRING INSPECTION SYSTEM

(75) Inventor: Frederick K. Blades, Boulder, CO (US)

(73) Assignee: Pass & Seymour, Inc., Syracuse, NY (US)

(*) Notice: Subject to any disclaimer, the term of this patent is extended or adjusted under 35 U.S.C. 154(b) by 0 days.

(21) Appl. No.: 11/084,164

(22) Filed: Mar. 21, 2005

(65) Prior Publication Data

US 2005/0212526 A1    Sep. 29, 2005

Related U.S. Application Data

(60) Provisional application No. 60/555,331, filed on Mar. 23, 2004.

(51) Int. Cl.
G01R 27/08    (2006.01)
(52) U.S. Cl. .................. 324/713; 324/66; 324/424; 324/508; 324/158.1
(58) Field of Classification Search ........... 324/713, 324/66
See application file for complete search history.

(56) References Cited

U.S. PATENT DOCUMENTS

| | | | | |
|---|---|---|---|---|
| 3,821,639 | A * | 6/1974 | De Langis | 324/508 |
| 4,121,152 | A * | 10/1978 | Hale et al. | 324/66 |
| 5,109,200 | A * | 4/1992 | Dushane et al. | 324/508 |
| 5,270,658 | A * | 12/1993 | Epstein | 324/424 |
| 5,493,206 | A * | 2/1996 | Boons | 324/66 |
| 6,072,317 | A * | 6/2000 | Mackenzie | 324/536 |
| 6,734,682 | B1 * | 5/2004 | Tallman et al. | 324/528 |
| 6,828,796 | B1 * | 12/2004 | Vang | 324/508 |
| 6,933,712 | B1 * | 8/2005 | Miller et al. | 324/67 |
| 6,965,238 | B1 * | 11/2005 | Rudholm et al. | 324/421 |

OTHER PUBLICATIONS

Brochure for Tasco, Inc. Circuit Mapper System CMT24S.
Brochure for Tasco, Inc. Inspector II Line Load Simulator.
Page 57 of Sporty's Catalog, showing Circuit Breaker Finder.

* cited by examiner

Primary Examiner—Diane Lee
Assistant Examiner—John Zhu
(74) Attorney, Agent, or Firm—Daniel P. Malley; Bond, Schoeneck & King PLLC

(57) ABSTRACT

A system for testing and documenting the electrical wiring in a building, for example, includes a Portable Circuit Analyzer (PCA) that is connected to the building's Load Center through an umbilical cord. The PCA is in wireless communication with a hand-held computer device, such as a personal digital assistant (PDA) as now widely available, provided with custom software according to the invention. The electrician connects the PCA in succession to each circuit in the building, operating each switch, and each fixture or appliance, while recording the test results of the circuit element on the PDA. The PCA measures the resistance and length of each circuit thus established. When the test process is completed, the PDA is enabled to generate a complete schematic diagram of the building, including, for example, an identification of the branch circuit to which each fixture, outlet, appliance, or other load or connection point is connected.

27 Claims, 23 Drawing Sheets

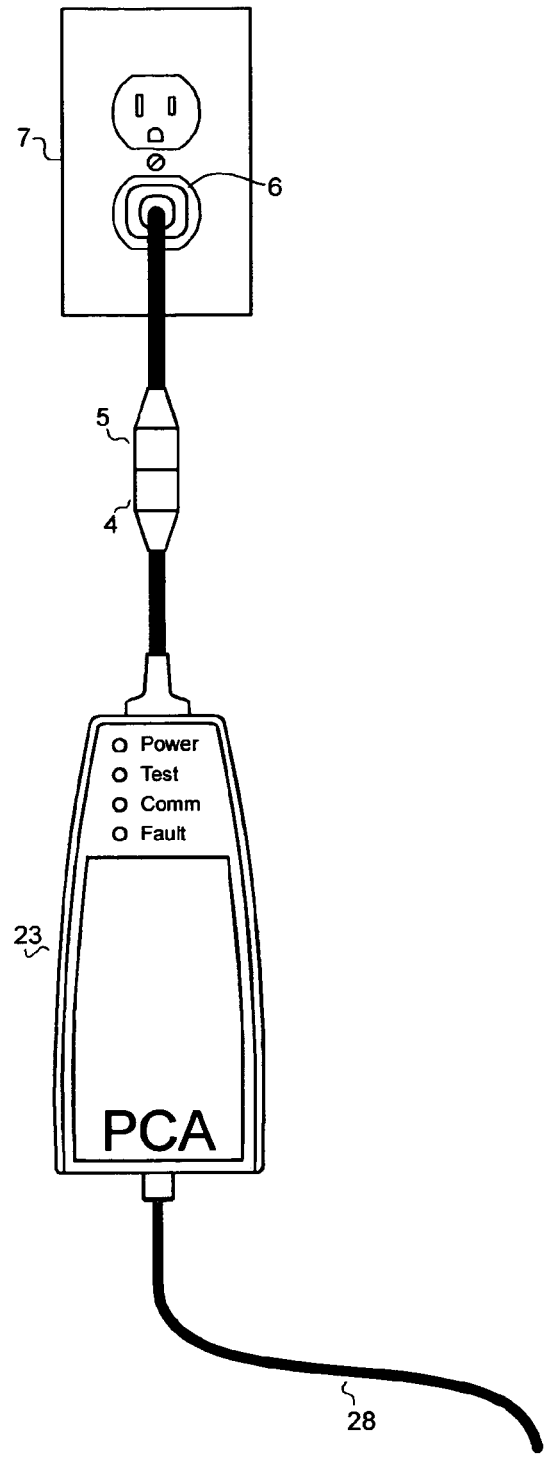
*Fig. 3*  *Fig. 4*

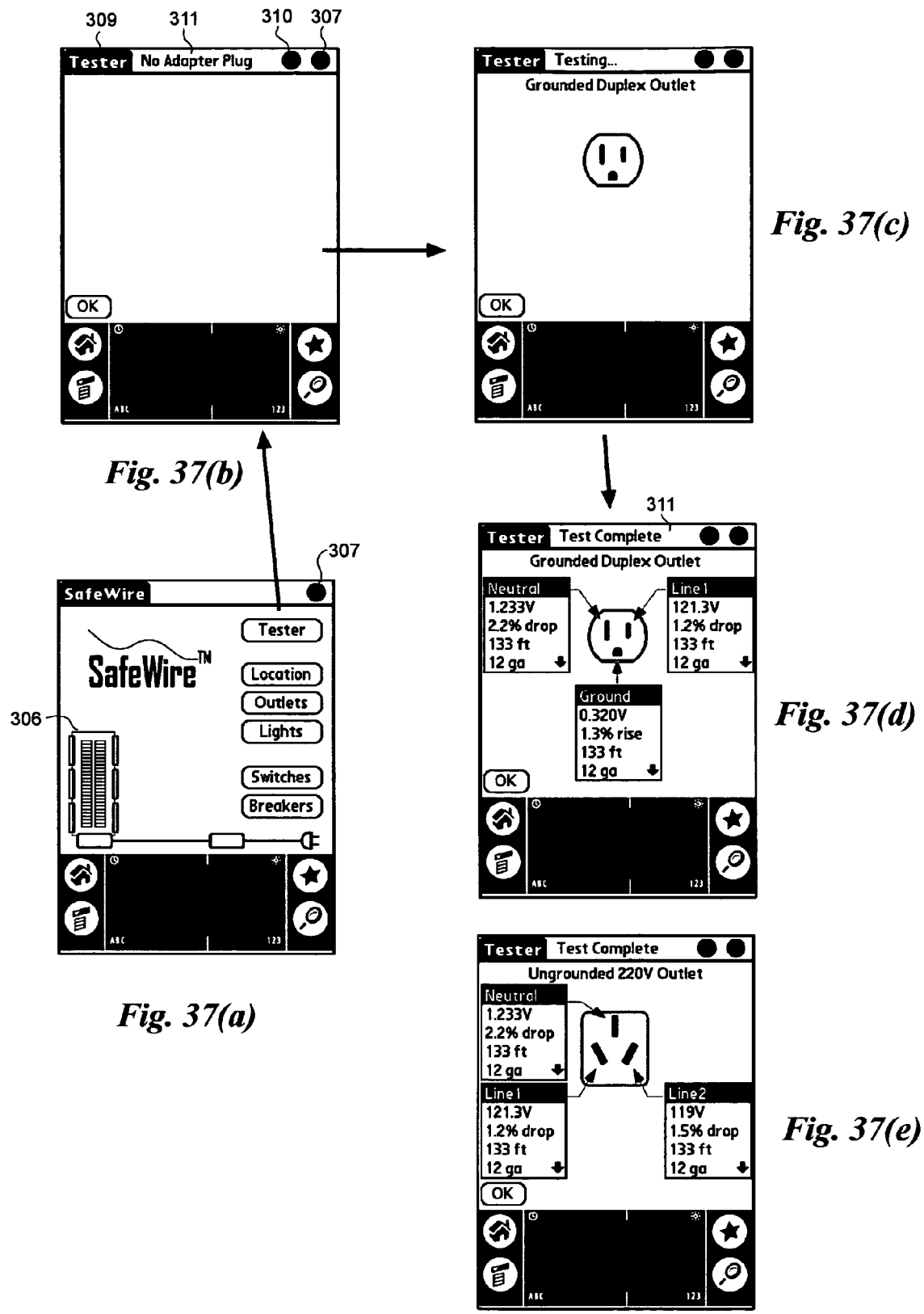

ELECTRICAL WIRING INSPECTION SYSTEM

CROSS-REFERENCE TO RELATED APPLICATION

This application claims priority from provisional application Ser. No. 60/555,331, filed Mar. 23, 2004.

FIELD OF THE INVENTION

This application relates to electrical test equipment for testing the integrity of electrical power distribution systems and for locating faults in the same.

Essentially all aspects of the present invention except the Electromagnetic Wire Locating method disclosed in Section 7 were disclosed in the Provisional Application listed.

BACKGROUND OF THE INVENTION

Residential dwellings, office buildings and businesses in the United States are typically wired in accordance with the National Electrical Code, inspected after initial construction, and then never again tested unless a problem occurs. Yet, after 10, 20, or 30 years of continuous use, wire insulation dries out and cracks, contacts become loose, light sockets degrade from heat, switches lose their spring, and numerous other aging processes take their toll. Additions and modifications to the electrical wiring over the years, either by certified electricians or perhaps a handyman, or even the owner herself add another level of uncertainty about the wiring. The difficulty is that these changes over time may eventually lead to a fire hazard, a shock hazard, unexpected failures and costly repairs, or perhaps all of these things.

Degraded or loose contacts and overloaded circuits can lead to contact arcing, a process that starts intermittently but given enough time may become persistent. Electrical arcs even at low currents can develop temperatures that exceed the ignition temperature of most common flammable materials and therefore pose a significant fire hazard. Prudently, in response to the electrical problems of the past, the National Electrical Code has been developed to mitigate this danger. For example, the code specifies that all wiring connections be contained in non-flammable junction boxes thereby reducing the probability that arcing at a connection will come into contact with flammable materials. Nevertheless, connections sometimes degrade over time and begin arcing, causing flickering lights, circuits to go out, and sometimes a fire. The US National Fire Protection Association estimates there were 38,300 residential fires of electrical origin in 1998 resulting in 284 deaths and 1184 injuries and $668.8M in direct property damage (from NFPA's U.S. Home Product Report, Appliances and Equipment Involved in Fires, January 2002). According to the NFPA "Electrical distribution equipment (i.e., wiring, switches, outlets, cords and plugs, fuse and circuit breaker boxes, lighting fixtures and lamps) was the third leading cause of home fires and the second leading cause of fire deaths in the United States between 1994 and 1998". But even when arcing does not result in a fire, it can cause electrical interference, flickering lights, intermittent service and eventually substantial damage to the arcing contacts themselves as well as flammable materials in the vicinity.

Aging wiring and/or incorrect repairs can also lead to wiring faults that present a shock hazard for building occupants. The loss of grounding protection, for example, particularly in wet areas, can present the danger of electrocution. The US Consumer Product Safety Commission estimates that of 230 electrocution deaths involving consumer products in the United States in 1995, 23% resulted from installed home wiring.

In addition to the danger implicit in developing electrical faults, the cost of waiting until faults develop into a noticeable problem can be high. Arcing on loose or dirty contacts of a circuit breaker, for example, will eventually lead to the need to replace the entire Load Center.

And finally, the electrical wiring in older buildings is often not well documented. The label on the Load Center of an older building is often barely legible or in error. The process of correcting the label, i.e., determining which circuit breakers control which circuits, can be quite time consuming, often requiring more time than is warranted absent a problem. Without adequate documentation, diagnosing problems is more difficult and branch circuits may be inadvertently overloaded.

A number of tools and instruments are commercially available to test and diagnose various aspects of household wiring. Inexpensive plug-in modules, for example, are commonly available to test whether a grounded socket is wired properly. Plug-in Ground-Loop Testers have also been marketed over the years to test the current-handling capacity of ground return paths. Common electrical test equipment, such as hand-held voltmeters and the like, and more sophisticated instruments such as oscilloscopes can also be used to test home electrical wiring; however, these tools yield only limited information. A thorough test of all the wiring in a home done manually would likely take a couple of electricians many days to complete and would therefore not be economically feasible.

There exists a need therefore for an instrument and method to quickly and economically test the entire electrical wiring system in a home, office, or business, so as to identify and locate dangerous conditions and flaws, and thereby reduce the chance of electrical fires and to protect occupants from the danger of electrical shock. A less important advantage of such testing would be to accurately document the system in the process.

TERMINOLOGY

One purpose of the SafeWire™ system is to test electrical wiring in homes and other structures for faults and degradation due to aging and as such has useful application in testing older wiring installations—installations that used fuses instead of circuit breakers and knob and tube wiring instead of Romex-type cables. Also, some electrical components are commonly known by multiple names. So to make clear and unambiguous this application and the attached claims a brief explanation of the terminology used herein follows.

The term "Load Center" in this application refers to the principal wiring distribution and protection point of an electrical wiring system. It is also commonly referred to as the "Service Panel", "Breaker Panel" or "Panelboard". In larger systems, an apartment building for example, there may be a single large electrical panel, typically known as the "service panel", and then a sub-panel for each apartment, the sub-panel in this context being referred to as a Load Center. Modern Load Centers typically contain a Main Circuit Breaker to protect the Load Center and a number of Branch Circuit breakers for branch circuit protection. Older Load Centers employ fuses instead of circuit breakers so to avoid the need to call out both terms at every reference, and thereby make this application more readable, the term "circuit breaker" shall include fuses of all types.

The term "branch circuit" refers to the circuit conductors between a branch circuit breaker and an outlet, light socket or directly-connected load that it feeds. A modern branch circuit is typically either a Romex-type cable or individual wires in a metal conduit the latter being typical in businesses. Branch circuits in homes over 50 years of age may be individual wires routed using a "knob and post" or "knob and tube" wiring scheme. Some early homes even made use of existing gaslight piping to route wires in. Thus, the term "branch circuit" shall include all of these wiring schemes.

The phrase "electrical power distribution system" in this application refers to all the components used to distribute electrical power throughout a structure. For example, in a home, it refers to the Load Center including all the circuit breakers or fuses, all the wiring, the outlets, switches, light sockets and anything else either permanently or semi-permanently installed to distribute electrical power. Semi-permanently installed wiring may include, for example, extension cords, outlet strips and the like.

The term "line voltage" refers to the standard voltage present on an electrical power distribution system and the informal term "Hot" refers to a conductor that has the line voltage on it.

SUMMARY OF THE INVENTION

The present invention is a modular diagnostic instrument, referred to by the inventor as the SafeWire™ system, that enables an individual electrician to test every electrical wire, every connection, every outlet, every switch, every light, and every appliance in a house, typically in a few hours or less. In use, the electrician first attaches a novel device to the Load Center and then, moving from room to room throughout a house, plugs cords into outlets, flips switches On and Off, unscrews light bulbs, turns appliances On and Off and enters descriptions into a hand-held Palm Pilot. The SafeWire™ system does the rest.

Briefly, the SafeWire™ system comprises a Portable Circuit Analyzer (PCA) that is connected to the building's Load Center through an umbilical cord. The PCA is in wireless communication with a hand-held computer device, such as a personal digital assistant (PDA) as now widely available, provided with custom software according to the invention. The electrician connects the PCA in succession to each circuit in the building, operating each switch, and each fixture or appliance, while recording the test results of the circuit element on the PDA. The PCA measures the resistance and length of each circuit thus established. When the test process is completed, the PDA is enabled to generate a complete schematic diagram of the building, including, for example, an identification of the branch circuit to which each fixture, outlet, appliance, or other load or connection point is connected.

For simplicity and clarity the SafeWire™ system is described herein relative to testing single-family residential homes. It applies just as well, however, to duplex homes, trailer homes, apartment buildings, office buildings, factories, libraries, museums, and the like, all of which employ electrical distribution systems that are substantially similar to residential electrical distribution systems. Indeed, SafeWire™ testing according to the invention applies to any structure that incorporates wiring to distribute electrical power. For example, it may be readily adapted for use on shipboard, aircraft, large vehicles, and other vehicles. It may be used to test outdoor lighting systems, temporary special event wiring for musical concerts or trade shows and other specialized applications. The means and methods disclosed are also shown on standard single-phase wiring, but with only minor changes could be used to test 3-phase power distribution systems. It is therefore to be understood that the disclosure of the use of the SafeWire™ system to test residential wiring in this application is provided specifically for the purpose of providing the simplest possible explanation of a complex system, and that the SafeWire™ system may be useful for testing a wide variety of other electrical wiring systems.

The SafeWire™ system is also described herein relative to wiring that conforms to electrical standards in the United States of America again only to simplify the presentation. Indeed SafeWire™ testing may prove more valuable elsewhere in the world where a combination of higher line voltages, older structures and perhaps less rigorous electrical standards may make faulty electrical wiring more dangerous.

BRIEF DESCRIPTION OF THE DRAWINGS

Drawings are Arranged in Accordance with the Sections that Reference them

1. Safe Wire™ System

FIG. 3 is a sketch of an Adapter Cable employed in the preferred embodiment.

FIG. 4 is a sketch of a Portable Circuit Analyzer (PCA) employed in the alternate embodiment

2. Safe Wire™ Portable Circuit Analyzer

Figure 7:
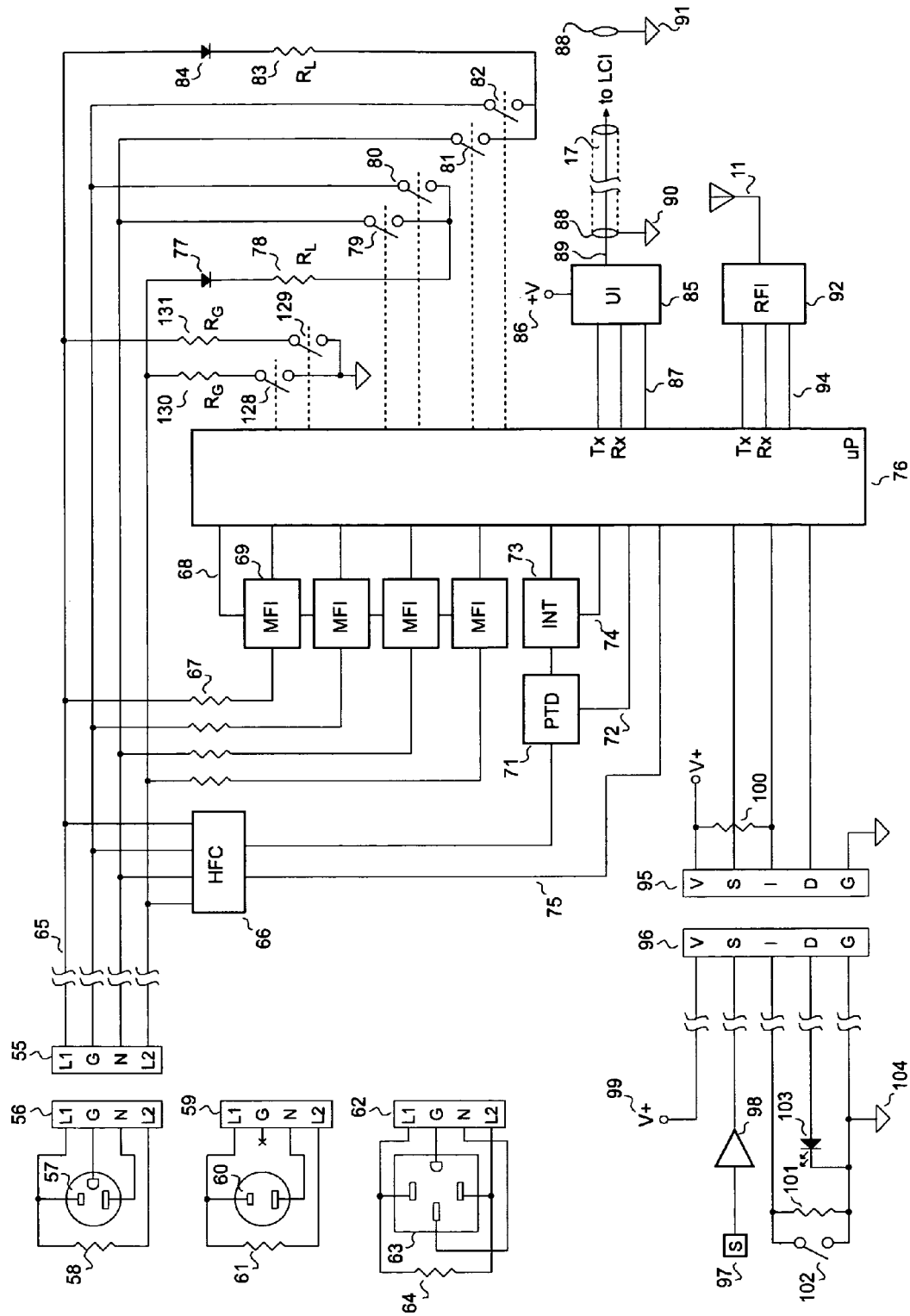

FIG. 7 is a simplified schematic diagram of one preferred embodiment of the SafeWire™ Portable Circuit Analyzer (PCA).

Figure 8:
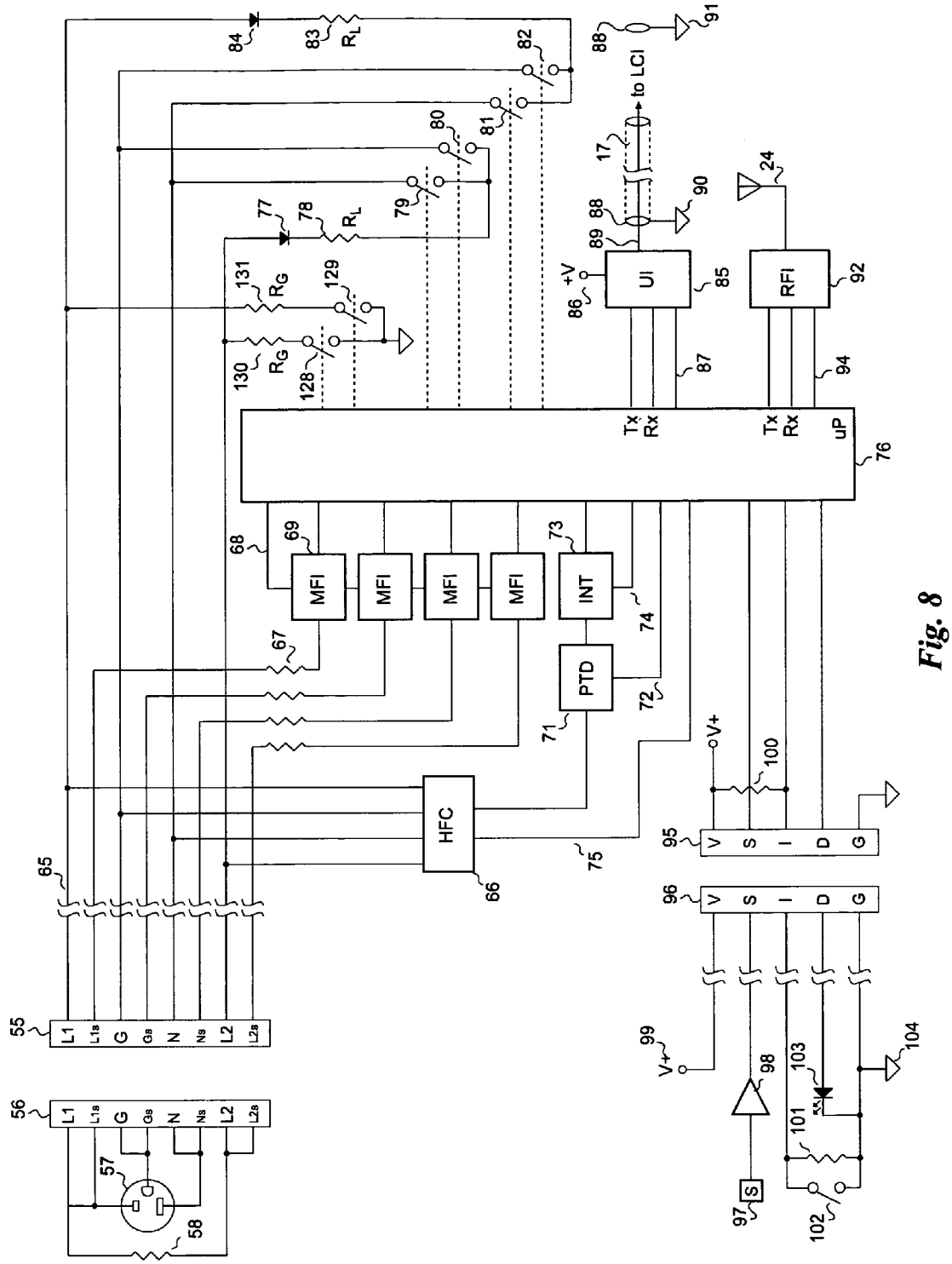

FIG. 8 is a simplified schematic diagram of an alternate embodiment of the SafeWire™ PCA.

Figure 9:
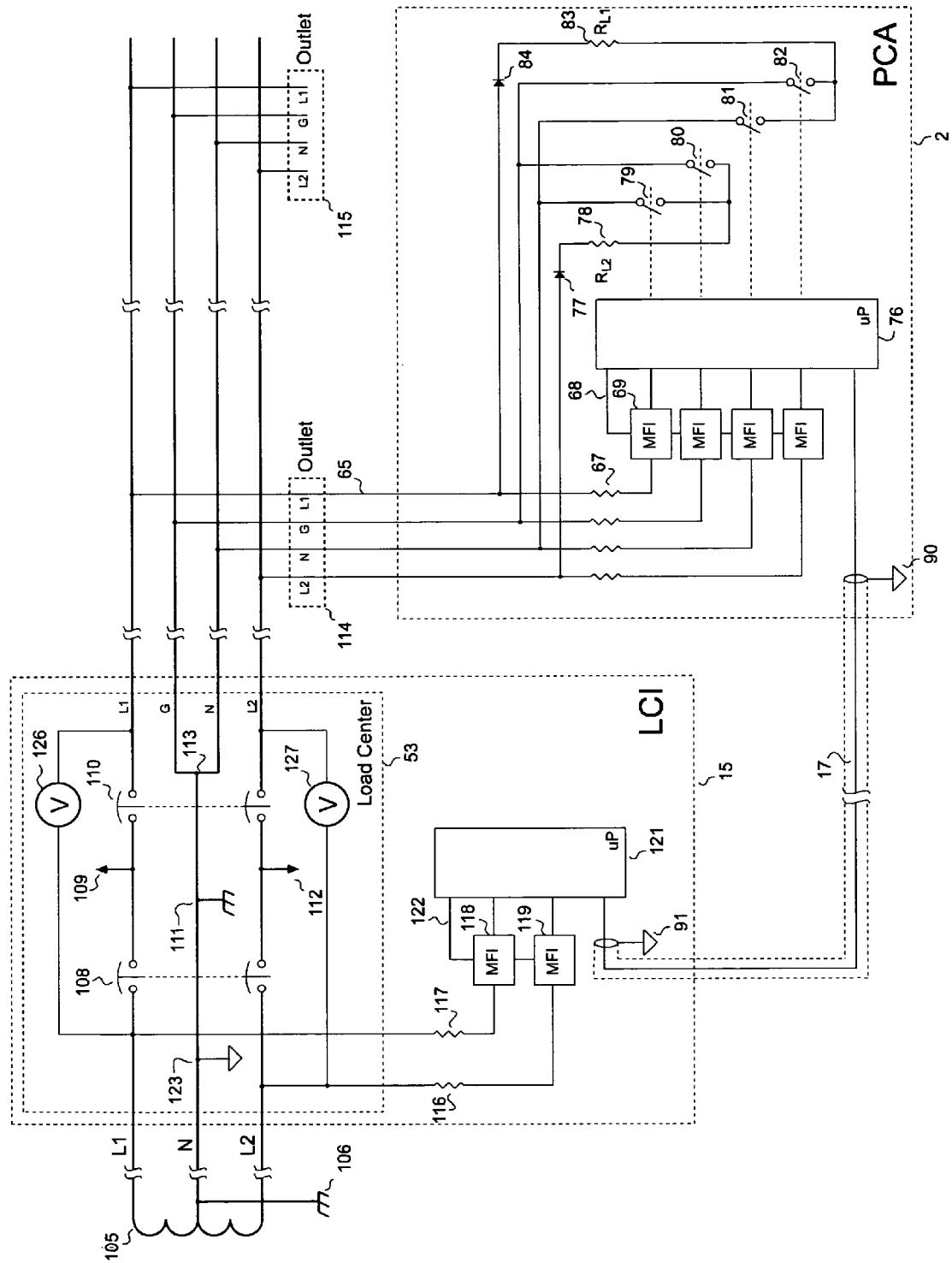

FIG. 9 is a simplified schematic diagram of circuitry for implementing an AC Balance Method, provided according to the invention, as applied at both an Outlet and the Load Center.

3. SafeWire™ Load Center Interface

Figure 10:
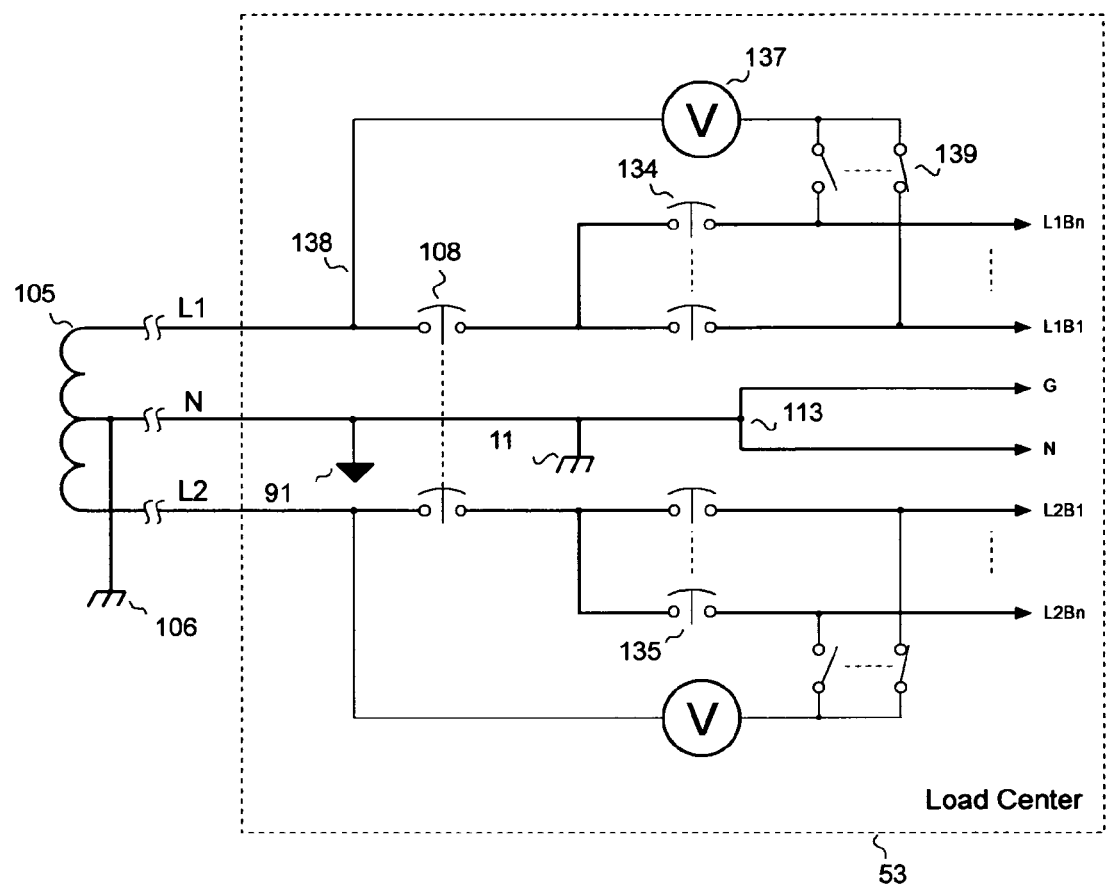

FIG. 10 is a simplified schematic diagram showing the measurement methods used by the SafeWire™ Load Center Interface (LCI).

Figure 11:
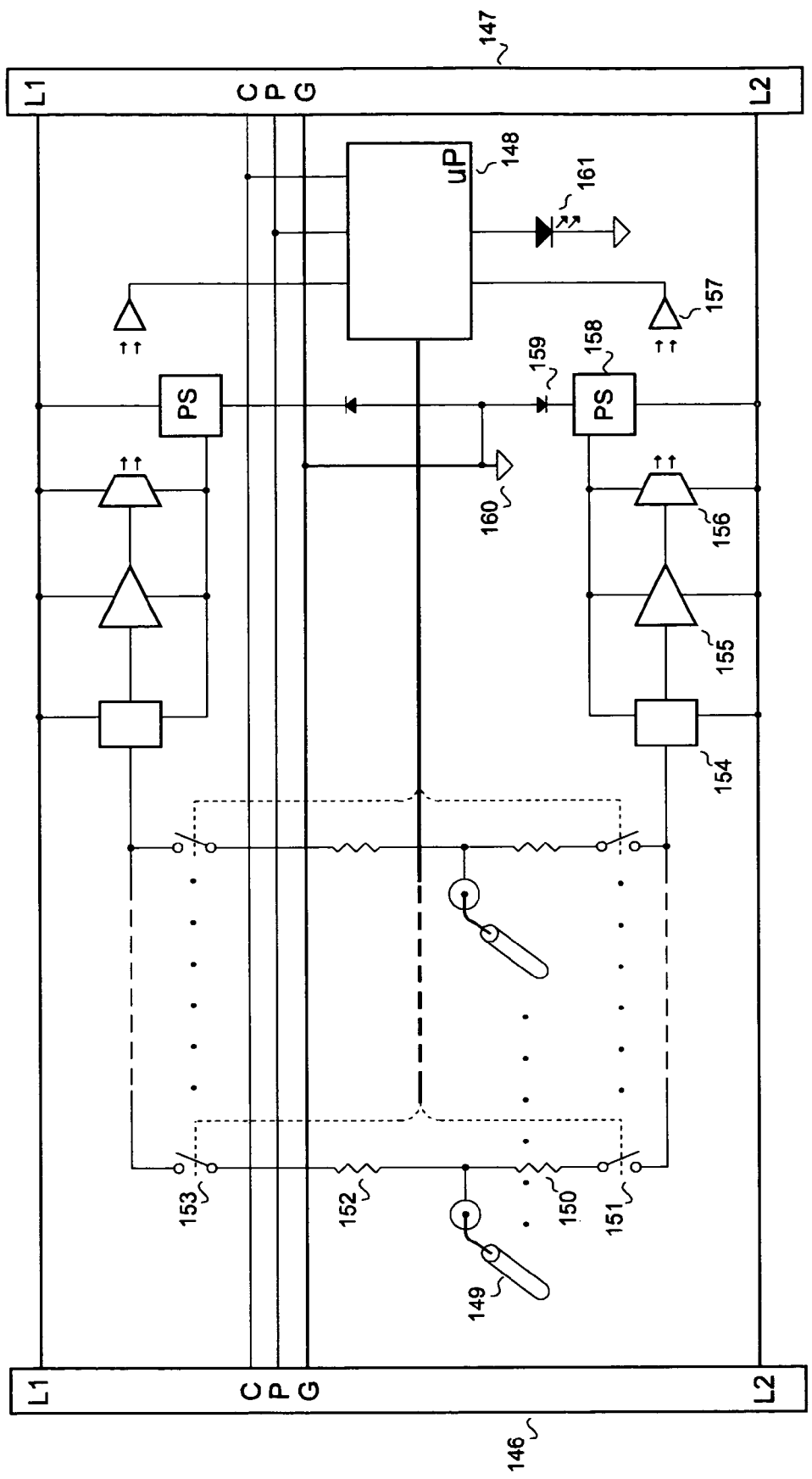

FIG. 11 is a simplified schematic diagram of an Input Module of the LCI.

Figure 12:
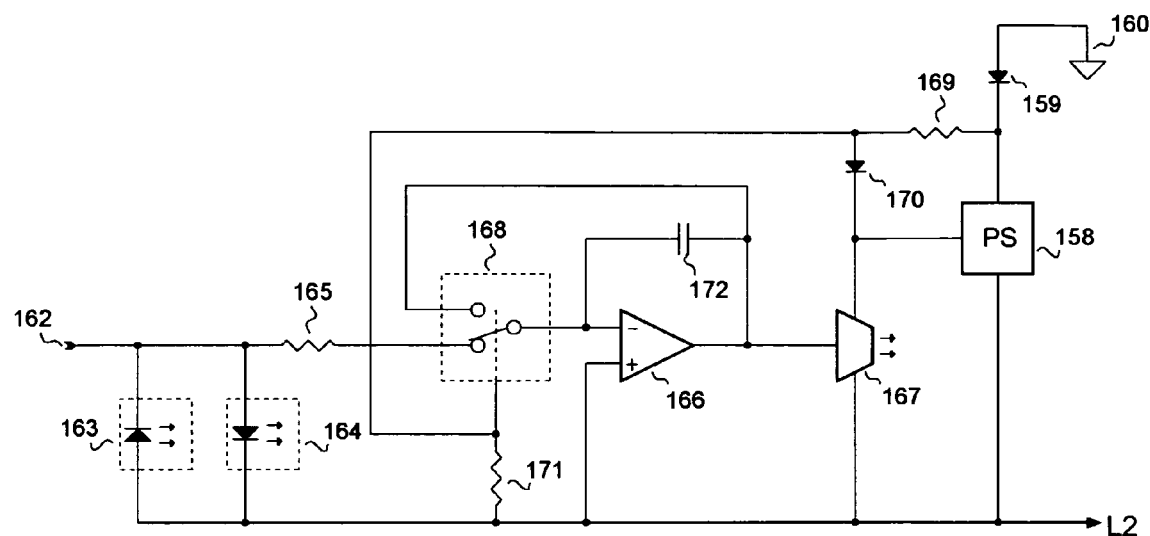

FIG. 12 is a simplified schematic diagram of the voltage measuring circuits in the Input Module.

Figure 13:
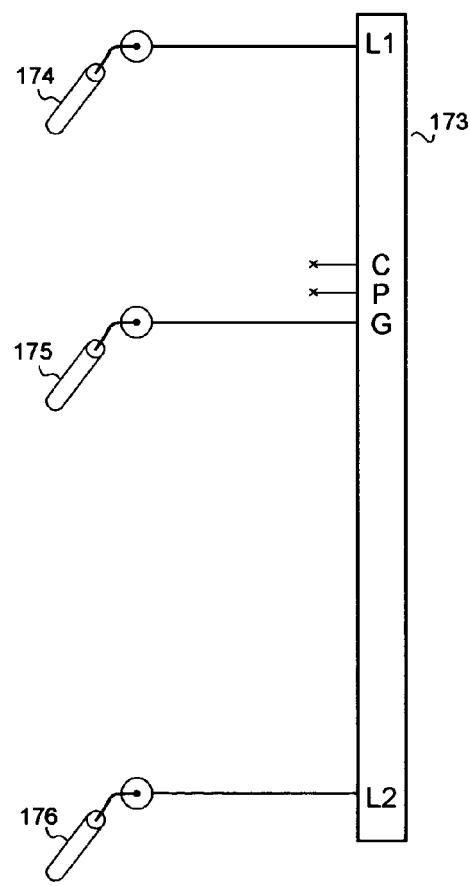

FIG. 13 is a schematic diagram of the Power Input Cable.

Figure 14:
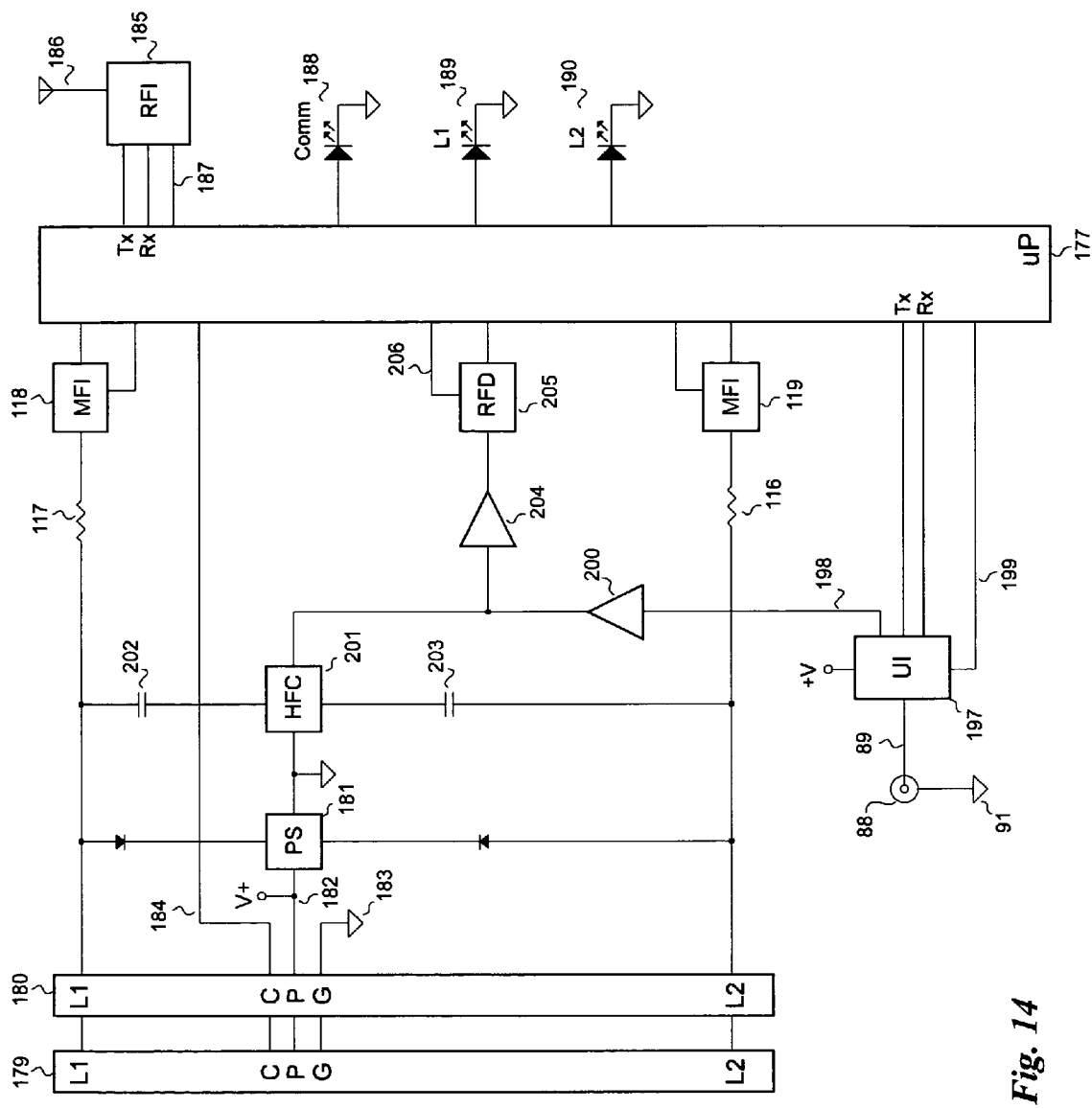

FIG. 14 is a simplified schematic diagram of a Main Module of the LCI.

4. SafeWire™ Magnetic Probe

Figure 15:
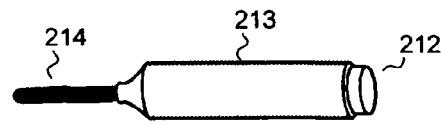

FIG. 15 shows an illustration of a Magnetic Probe.

Figure 16:
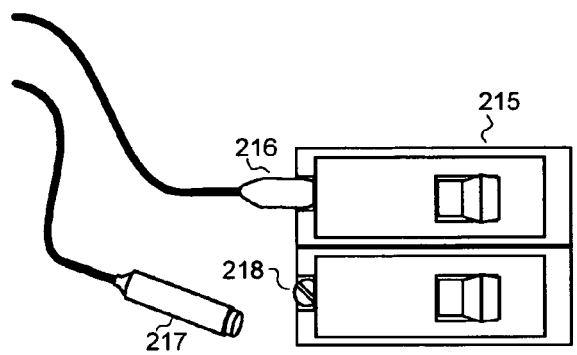

FIG. 16 shows one Magnetic Probe attached to one pole of a two-pole circuit breaker and another Magnetic Probe just removed from the second pole.

Figure 17:
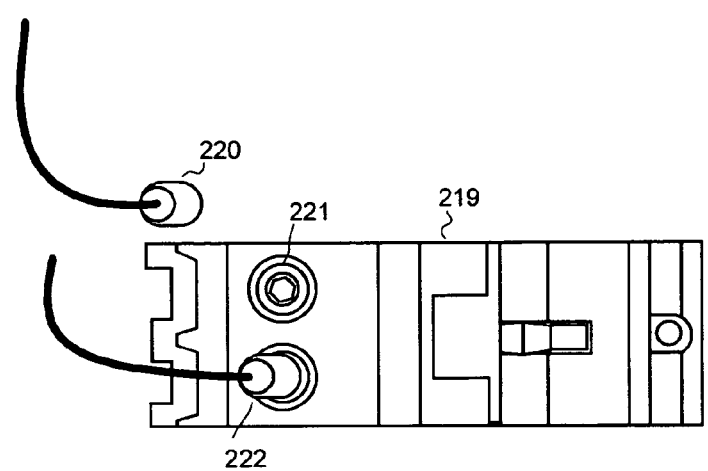

FIG. 17 shows one Magnetic Probe attached to one pole of a main circuit breaker and another Magnetic Probe just removed from the second pole.

Figure 18:
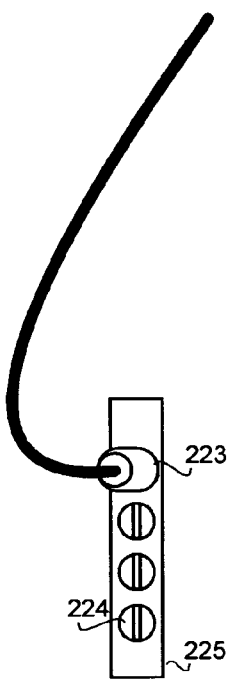

FIG. 18 shows a Magnetic Probe attached to a Grounding bus bar.

Figure 19:
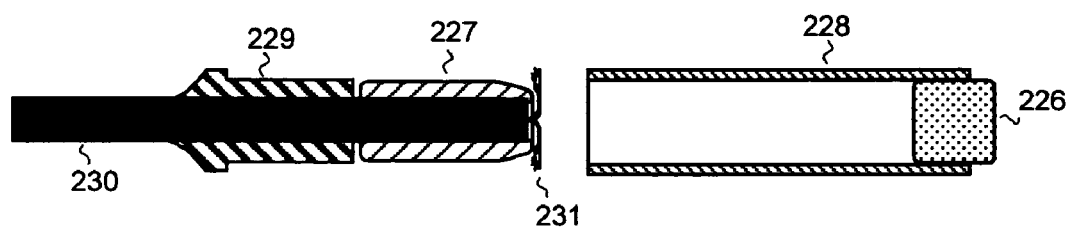

FIG. 19 shows an expanded cross-sectional view of one embodiment of the Magnetic Probe.

Figure 20:
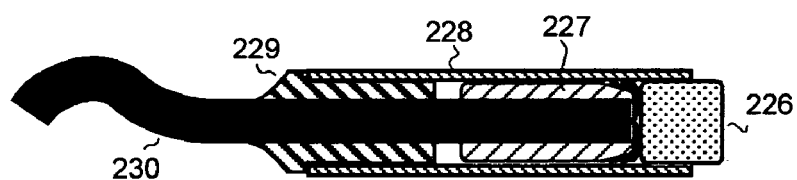

FIG. 20 shows an assembled cross-sectional view of the Magnetic Probe of FIG. 19.

Figure 21:
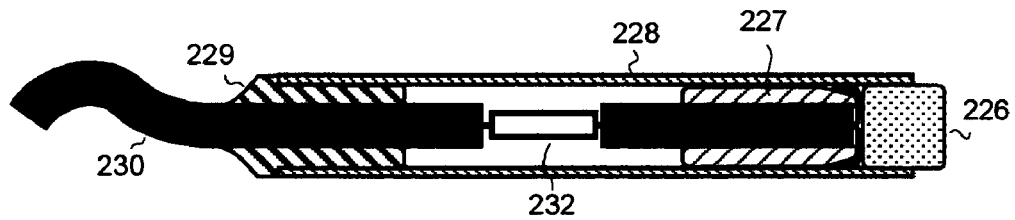

FIG. 21 shows an assembled cross-sectional view of the preferred embodiment of the Magnetic Probe.

5. AC Balance Method

Figure 22:
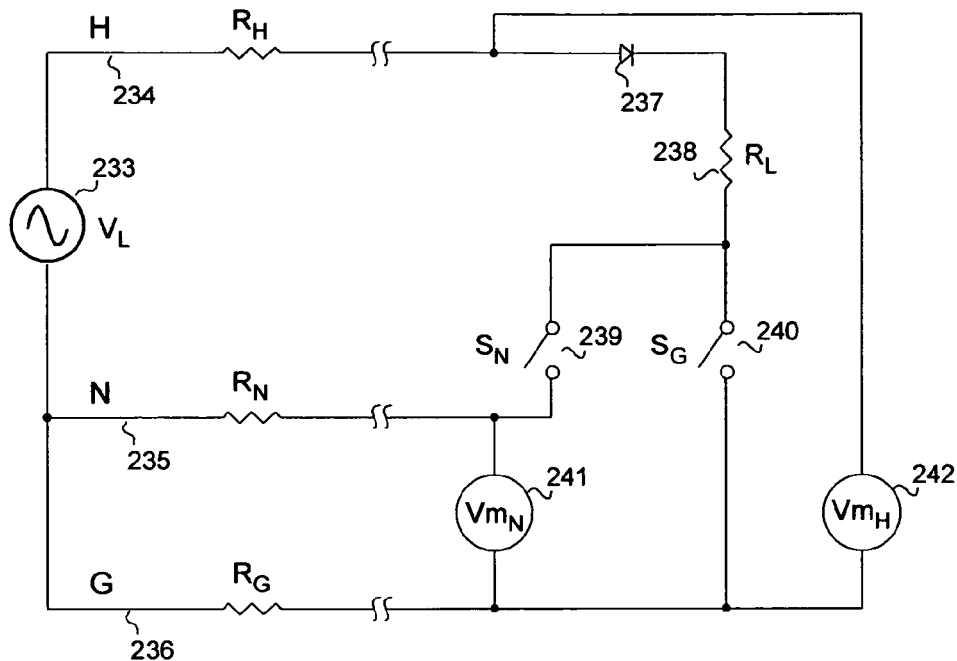

FIG. 22 shows a stand-alone tester that uses the AC Balance Method of the present invention.

Figure 23:
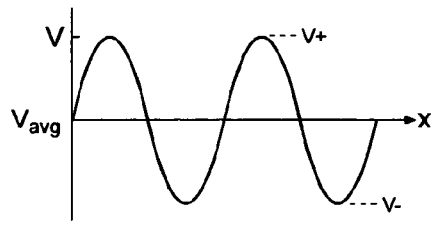

FIG. 23 shows a graph of typical Line Voltage versus Time measurements.

Figure 24:
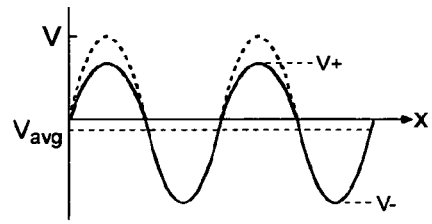

FIG. 24 shows a graph of Line Voltage versus Time with a rectified load applied.

Figure 25:
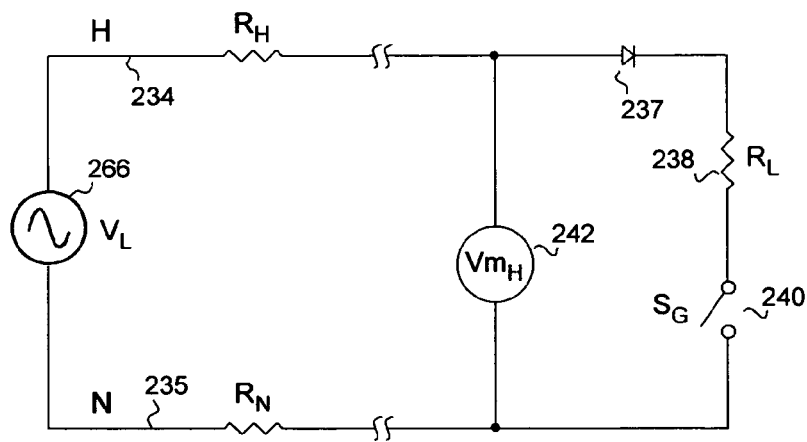

FIG. 25 shows a stand-alone tester on an ungrounded outlet.

Figure 26:
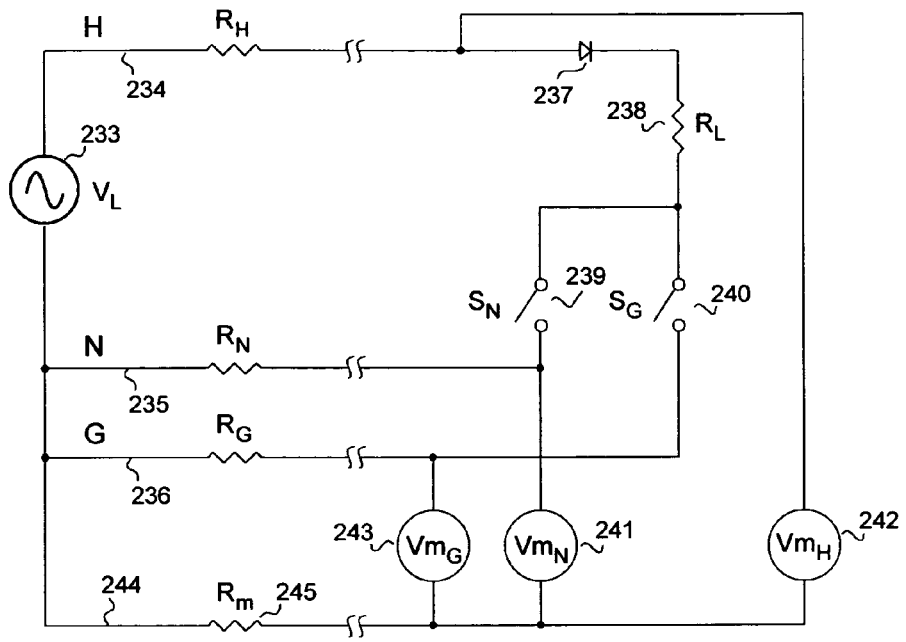

FIG. 26 shows a tester that uses the AC Balance Method with a separate Ground reference.

6. Least-Time Propagation (LTP) Method

Figure 27:
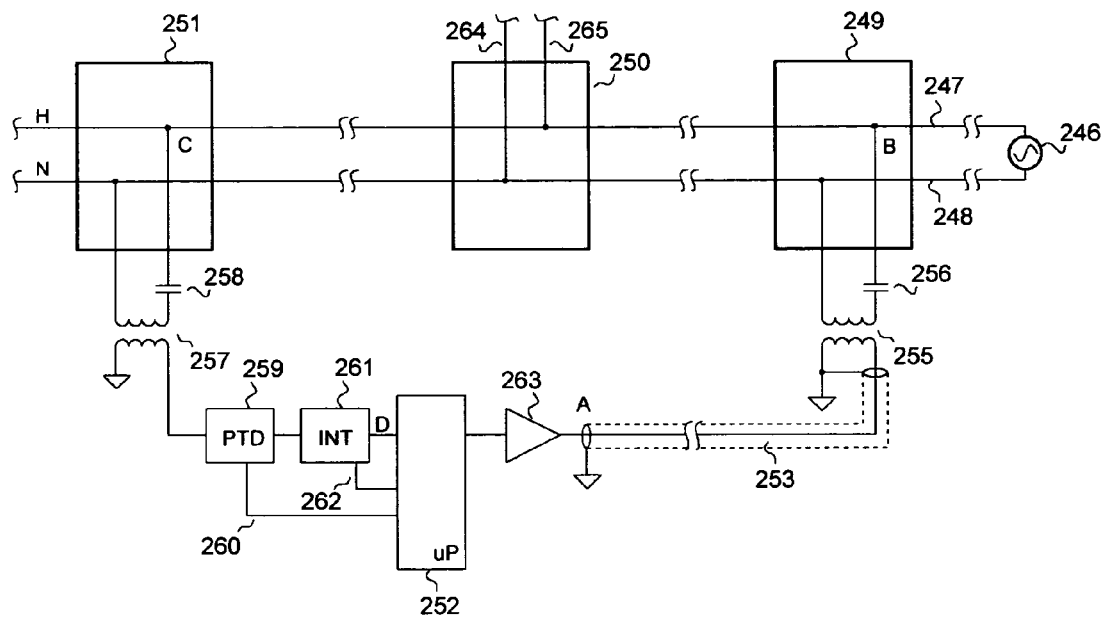

FIG. 27 shows an LTP measurement circuit on a typical 2-wire Branch Circuit.

Figure 28:
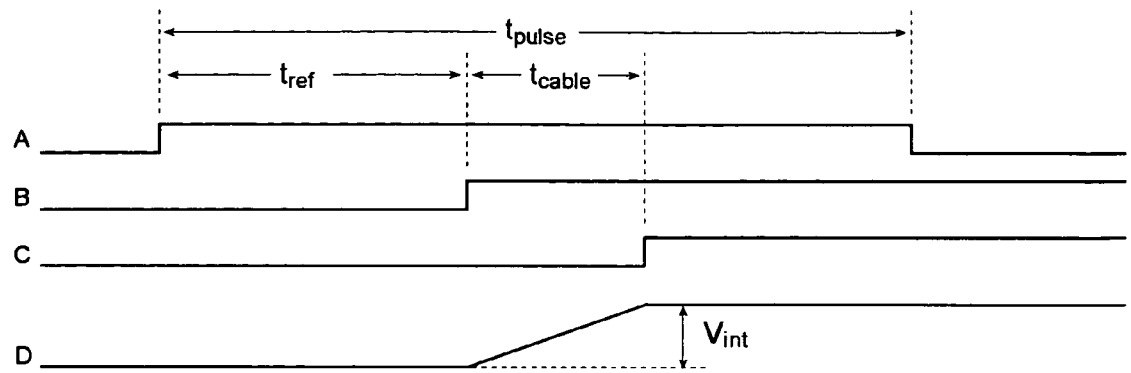

FIG. 28 shows the timing waveforms of the circuit of FIG. 27.

Figure 29:
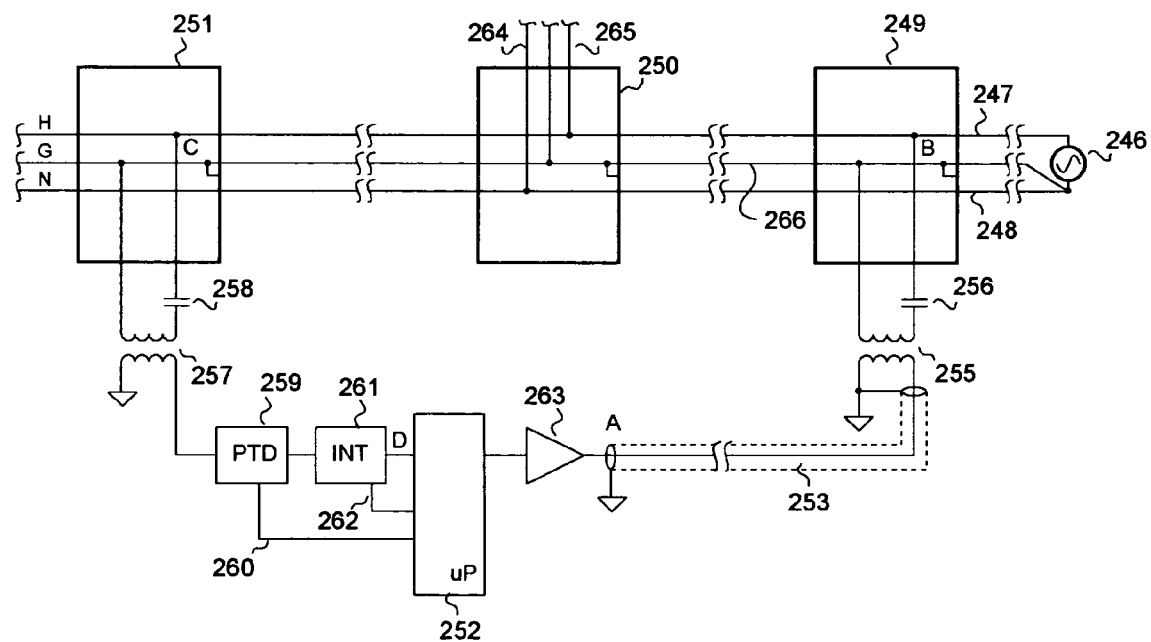

FIG. 29 shows an LTP measurement circuit on a typical 3-wire Branch Circuit.

Figure 30:
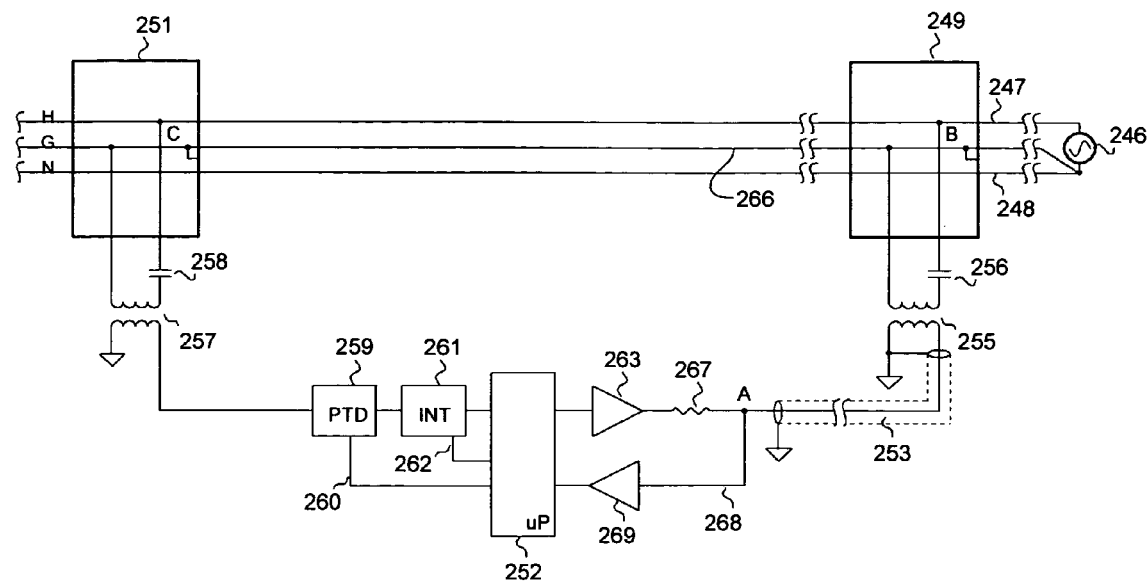

FIG. 30 shows an LTP measurement circuit connected between two outlets.

7. Electromagnetic Wire Locating (EWL) Method

Figure 31:
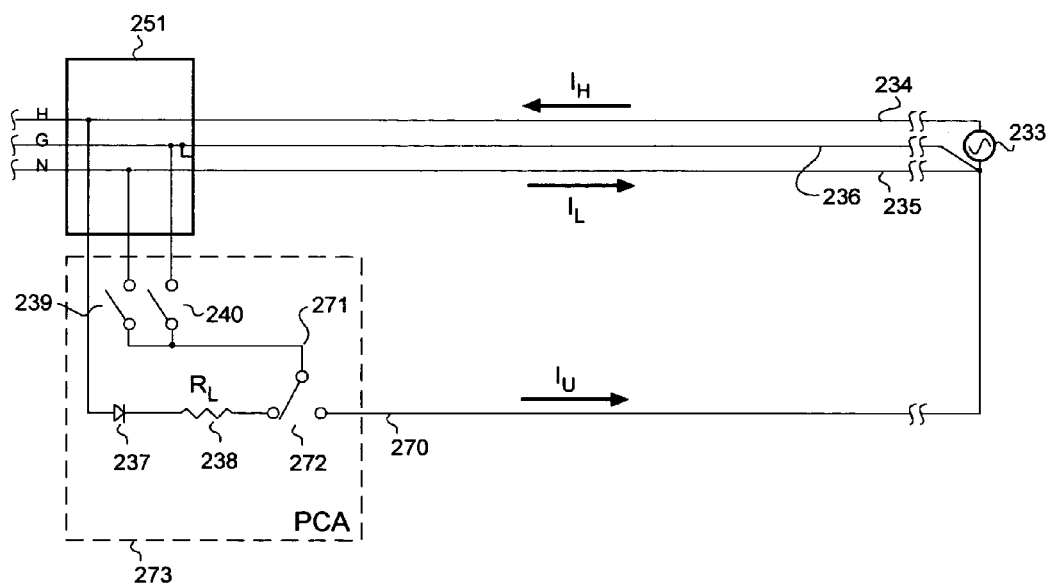

FIG. 31 is a simplified schematic diagram showing a modified PCA connected to a residential outlet.

Figure 32:
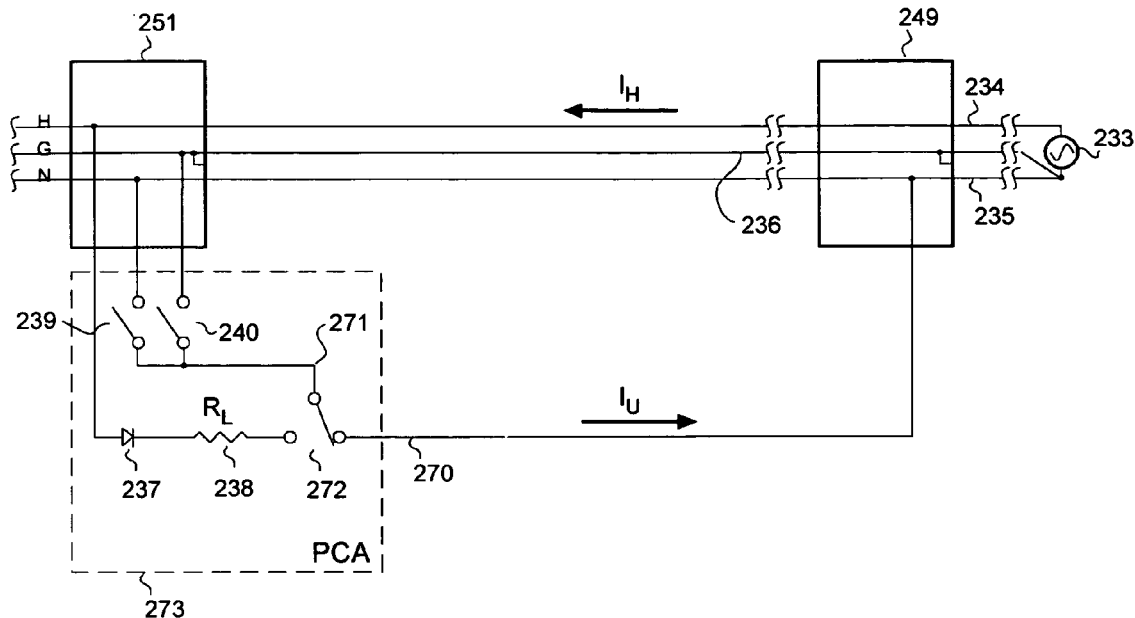

FIG. 32 is the simplified schematic of FIG. 31, connected for testing two outlets.

Figure 33:
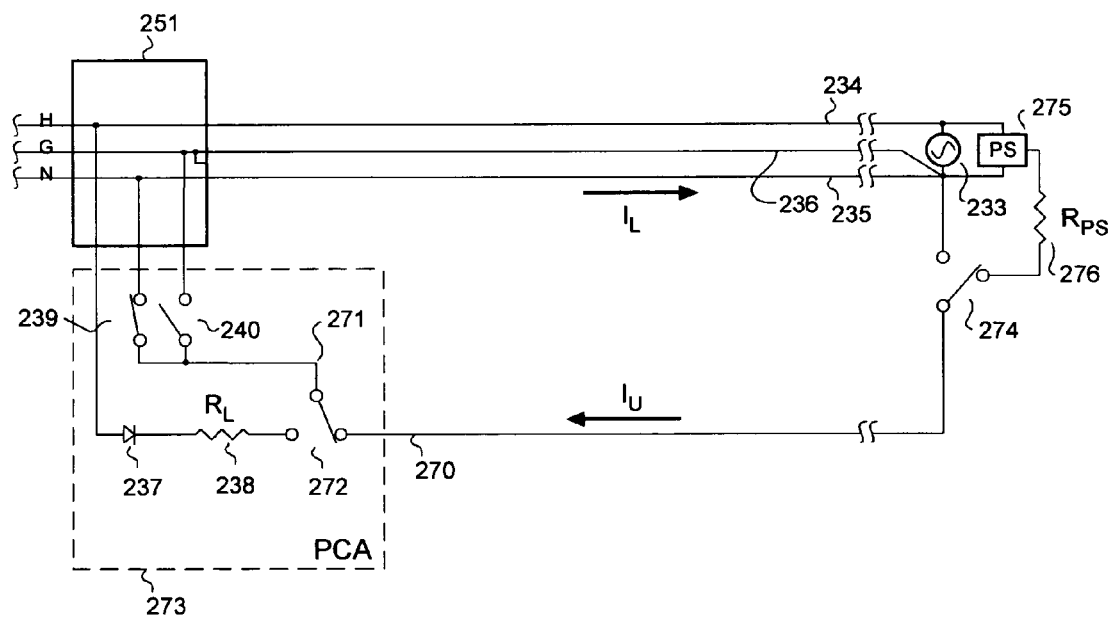

FIG. 33 is the simplified schematic of the EWL tool adapted for locating unpowered wires.

Figure 34:
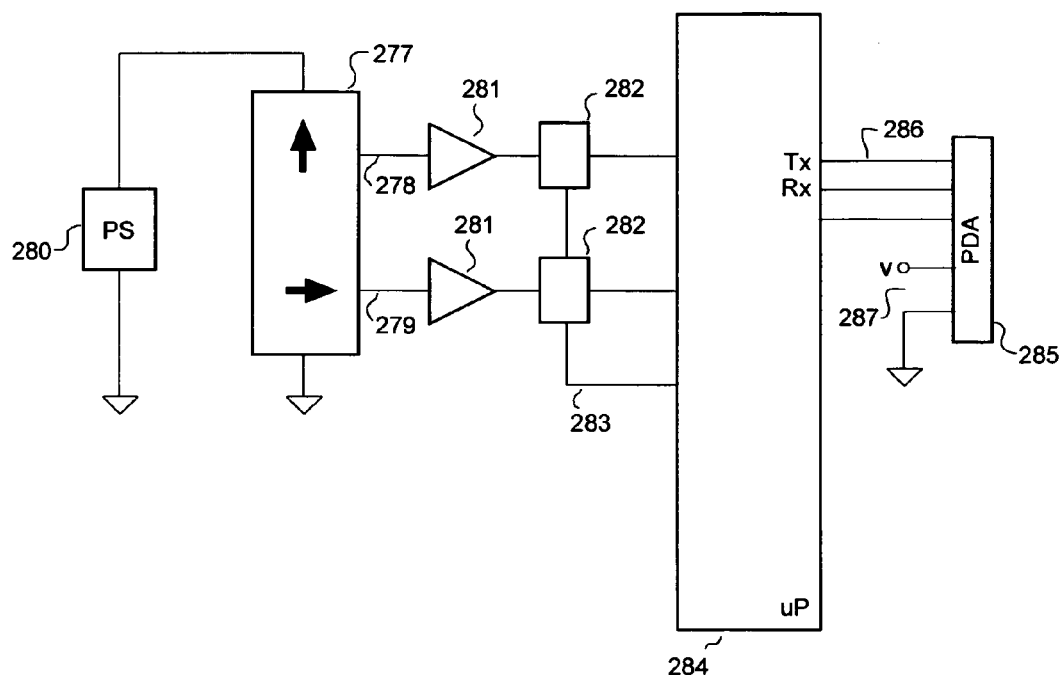

FIG. 34 is a simplified block diagram of the circuit of the EWL tool.

Figure 35:
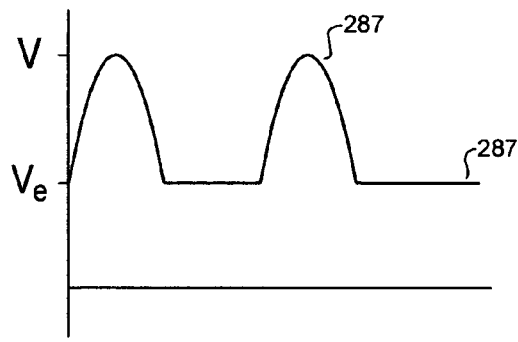

FIG. 35 is a graph of the output signal of one axis of the magnetic field sensor.

Figure 36:
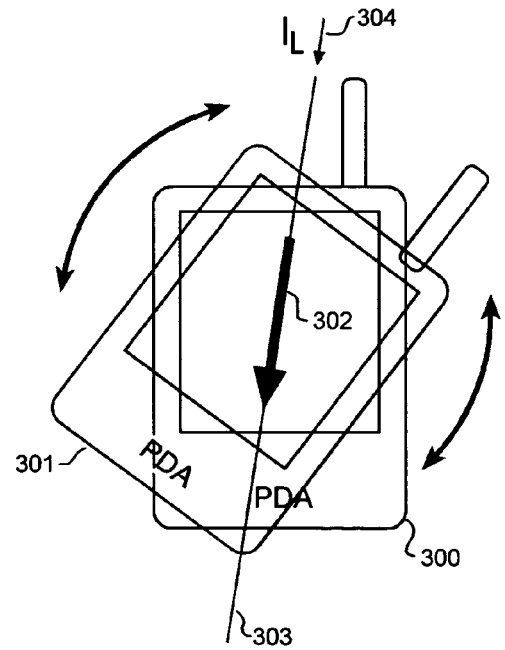

FIG. 36 is a simplified physical illustration of the EWL tool in use.

8. Software and System Operation

FIG. 37 is an illustration of the top-level PDA screen and various Tester screens.

FIG. 38 is an illustration of the top-level PDA screen and the Location, Outlet and Light screens.

Figure 39B:
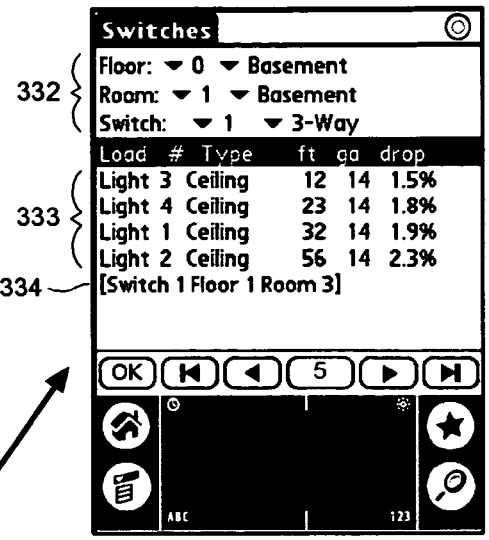

FIG. 39 is an illustration of the top-level PDA screen and Switches and Circuit Breakers screens.

DESCRIPTION OF THE PREFERRED EMBODIMENTS

1. Overview of the Safe Wire™ System

Figure 1:
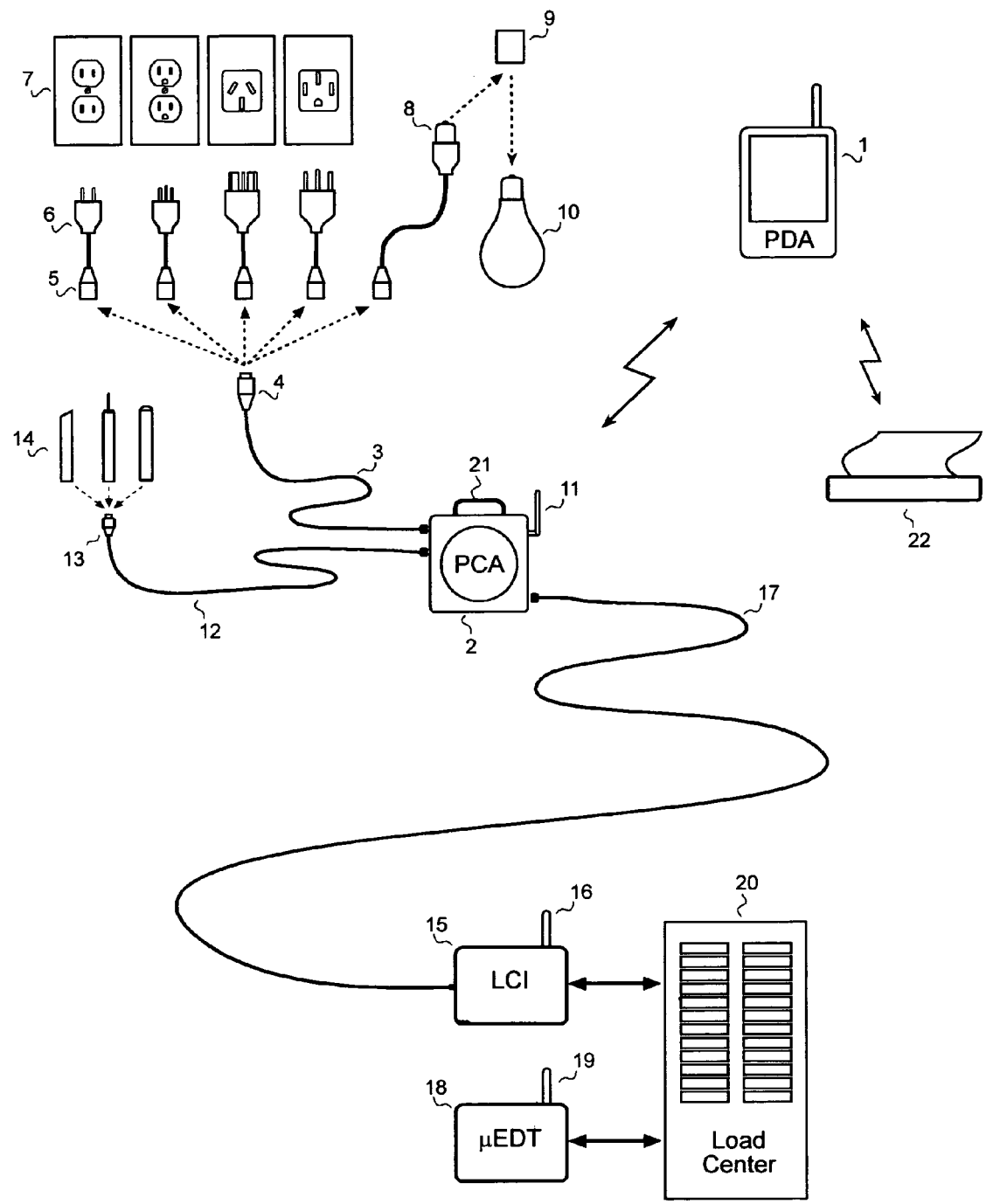
FIG. 1 is a simplified physical diagram of one preferred embodiment of the SafeWire™ System according to the invention.

The preferred embodiment of the SafeWire™ System of the invention is shown in simplified physical form in FIG. 1. The system is made up of four basic components that work together to enable a single electrician to take extensive measurements on a household wiring system in a convenient manner and in a relatively short period of time.

An off-the-shelf handheld computer 1, commonly known as a Personal Digital Assistant (PDA), provides the computing power and a user interface for the SafeWire™ system. Custom SafeWire™ software runs in the PDA and the electrician uses it to control and review all aspects of the SafeWire™ system. In the preferred embodiment of the present invention, the PDA 1 is one of several commercially-available PDAs with integral radio communication capabilities, such as Bluetooth, to wirelessly communicate with the other SafeWire™ components. Provision of wireless communication (as opposed to a wired connection) enables the electrician to hold the PDA in one hand, communicating with all the other elements of the system, while turning light switches On and Off with the other hand, for example. As will be seen below, this enables each component of the wiring system to be conveniently tested, and the result of the test simultaneously recorded.

The second basic component of the SafeWire™ system is the Portable Circuit Analyzer or PCA shown as 2 in FIG. 1. The PCA 2 is carried by the electrician throughout the house to perform testing on outlets, light circuit, light fixtures, appliances and more while household power is on. A test cord 3, typically on the order of 25 feet long, plugs into the PCA 2. A connector 4 at the end of the test cord 3 is disposed to accept any of several adapter cables 5 via mating connectors 5a. These adapter cables 5 allow the PCA 2 to be readily connected to any one of several household outlet types 7 via matching plugs 6 (one physical embodiment of the adapter cable 5, this one for a standard outlet, is shown in FIG. 3). All outlet types found in both new and older residential wiring systems, including 220 volt types, are preferably supported by provision of the corresponding adapter cables 5, only a sampling of which are shown in FIG. 1. A spring-loaded lamp socket plug 8 is also provided to allow the PCA to connect to a lamp socket 9 by removing the bulb 10 and then inserting the plug 8. As discussed in detail below, the PCA 2 (in combination with the other components of the system) measures the resistance of each circuit, thus verifying its condition, as well as the length of each circuit, enabling a schematic diagram to be drawn in an automated fashion by the PDA 1, and printed on a printer 22.

The PCA 2, as disclosed in detail below, contains an embedded microprocessor, dedicated analog measuring circuitry, and a radio link for wireless bi-directional communications with the PDA via a short antenna 11. A separate test cord 12 connects the PCA 2 to one of several SafeWire™ Sensor Probes 14 through connector 13. A simple probe, for example, would test the ground resistance of switch plates, appliances and the like, to determine whether they are correctly grounded or not. Another such probe is a Novel SafeWire™ Magnetic Field Probe, as disclosed in detail in Section 7, that employs a novel method based on the SafeWire™ system to better locate and trace wires in a wall or in conduit. Yet another is a Non-contact Infrared Temperature Sensor Probe, which can be used to sense the temperature of lamp fixtures. Other specialized sensing probes can be made available as needed.

The third basic component of the SafeWire™ system is the Load Center Interface or LCI 15, which attaches to the home's Load Center 20 and serves to monitor signals in the Load Center that result from active load testing performed by the PCA 2, for example, as the electrician moves from outlet to outlet, fixture to fixture, appliance to appliance, and so on, throughout the house. The LCI 15 also contains an embedded microprocessor, dedicated analog measuring circuitry and a Bluetooth radio link to enable wireless bi-directional communications with the PDA 1 via its own short antenna 16.

A standard single-conductor coaxial "umbilical" cable 17 connects the LCI 15 to the PCA 2. This umbilical cable 17 may be coiled up inside the PCA by means of a spring-loaded reel mechanism that extends and retracts the cord as the electrician moves about. The length of the umbilical cable 17 should be on the order of 100 feet long to reach from the Load Center 20 to any outlet in a typical home. One or more umbilical extensions can be used as needed for unusually large homes.

It is envisioned that the PCA 2 will be carried from room to room in the house to be examined by the electrician using handle 21, then placed on the floor or a convenient surface near the outlet or lamp socket to be tested. The test cable 3 of the preferred embodiment, shown separately in FIG. 3 and having attached to it the cable 5 with the appropriate adapter 6, is then plugged into the outlet to be tested. With a test cable 3 say 25 feet long, the PCA 2 can remain stationary as the electrician moves from outlet to outlet in a room, testing each in succession (the testing process itself being described in detail below). The PCA enclosure is preferably weighted enough to remain stationary against the slight tugging that may result and may include storage spaces for the PDA and the various adapter cables.

The umbilical cable 17, though presenting some inconvenience to the electrician, serves multiple useful purposes and as such is an important component of the present invention. First, provision of the umbilical cable 17 allows hard-wired, secure electrical connection of the PCA 2 to the Load Center 20. Among other advantages, this fact provides a known ground reference for use by the PCA to test branch circuits, which is particularly useful when testing older ungrounded 2-prong outlet types, and in the determination of whether a particular outlet is completely disconnected from the system or not. Second, the umbilical cable 17 carries a DC voltage to the PCA to continuously power the microprocessor and analog circuits within, so that a separate power supply, with the attendant batteries, chargers, and the like, is not required. Third, umbilical cable 17 serves as a wideband conduit for high-frequency signals used by the PCA to measure the length of wires from the outlet under test to the Load Center. Fourth, umbilical cable 17 is used to carry high-speed communication signals between the LCI and the PCA. More specifically, while in the preferred embodiment of the SafeWire™ system the PDA 1 communicates with the PCA 2 via a Bluetooth radio link, the electrician and his PDA usually being in the same room as the PCA, it is a distinct advantage to have this hardwired communication link between the PCA 2and the LCI 15, because often the Load Center 20 will be some distance away (perhaps out of Bluetooth radio range) and in a basement or other location where radio communications may not work well. Thus, the Bluetooth radio link indicated by antenna 16 on the LCI 15 of FIG. 1 is only used when direct radio communication between the PDA 1 and the LCI 15 is required, as for example, when setting up the LCI 15 before the PCA is connected, or when the PCA 2 is out of radio range. A fifth useful application of the umbilical cable 17 is as a conduit to carry load current back to the Load Center for the purpose of locating and tracing hidden wiring in accordance with the novel SafeWire Magnetic Field Probe of the present invention. It is apparent, therefore, that the use of the umbilical cable 17 enables these many features of the SafeWire™ system that would otherwise not be possible.

The fourth and final basic component of the SafeWire™ System is the Micro-Energy Dielectric Tester (µEDT) 18, an optional component used to perform non-destructive voltage breakdown tests on the wiring, by testing the dielectric qualities of the insulation. Such dielectric testing is useful, as it can reveal developing parallel faults that may result in arcing. However, it can only be performed on branch circuits where no loads are connected (so that there is no connection between the circuit conductors); for example, only when all loads have been unplugged or all light bulbs have been unscrewed a couple of turns. If such testing is desired, it is most conveniently done using the following procedure: as the electrician moves through the house during testing using the PCA 2 she can simply unplug and leave unplugged (or switched off or unscrewed) every load in the house. She then goes to the Load Center 20, turns all power off, removes the LCI 15, attaches the µEDT 18 and proceeds with dielectric testing, a process that takes only a few seconds for each branch circuit. If a load is inadvertently left plugged in on one branch, the µEDT 18 will not damage it; it will simply report to the electrician that there is a load present, instructing her to either remove it or skip testing that branch circuit.

There are significant advantages to testing homes in this order. As will be seen, PCA testing will show not only the resistance of each wire and connection but also the length of each wire and what it is connected to. After simply and quickly moving through the house and connecting the PCA to each load, fixture, outlet, and appliance, while recording identification data as to each, the PDA will have collected enough information to produce a complete schematic of the house. Now if during subsequent µED tests a potential parallel arc fault is found, e.g., the wires are somewhere too close together, the µEDT will reveal the fault and report the length of wire from the Load Center to the fault in feet. Since PCA testing has already measured and compiled the wire lengths to each and every outlet and light socket in a home, the system has the data to automatically translate this distance, i.e., the length of wire from the Load Center to the fault, into the actual location of the fault. For example, a fault that is 33.2 feet from the Load Center on Branch Circuit 3L might be better reported as a fault between outlets 2 and 3 in the master bedroom, 4 feet to the left of outlet 3.

Figure 2:
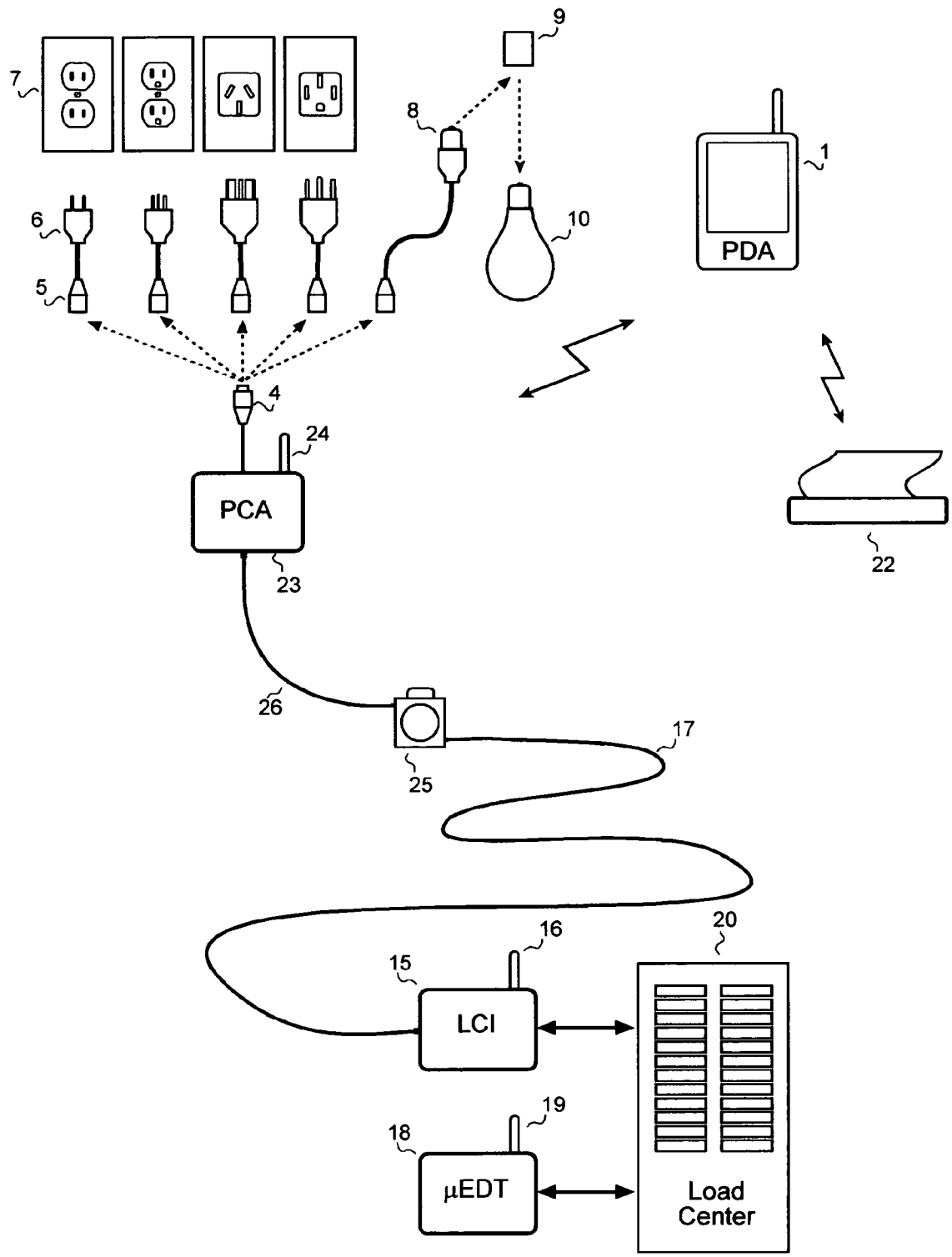
FIG. 2 is a simplified physical diagram of an alternate embodiment of the SafeWire™ System.

An alternate embodiment of the system is shown in FIG. 2, the only difference being that the signal processing circuits of the PCA 2 are contained in a separate enclosure 23 that is located near the adapter plug 4 (one possible physical embodiment of this PCA enclosure is illustrated as 23 in FIG. 4), while the reel mechanism 25 for convenient storage of the umbilical cable 17 is housed separately. The reason this physical implementation may be preferred over the embodiment of FIG. 1 is because the signal processing circuits PCA are located closer to adapter 4, which may improve circuit performance. For example, the SafeWire™ distance measuring technique is based on sensing the time of arrival of a pulse transmitted down the household wiring from the Load Center, and the length of test cable 3 in FIG. 1 may degrade the signal. Another example is that during load testing, the resistance of the test cable 3 will be part of the measured resistance. It is anticipated by the inventor, however, that signal conduction problems with a longer test cable 3 can be resolved satisfactorily using various compensation techniques. Note that although the Multi-function sensor probe 14 is not shown in the embodiment of FIG. 2, it is nonetheless part of this embodiment of the invention.

The preferred embodiment of FIG. 1 also has advantages. As noted, the purpose of standard SafeWire™ testing is to test every outlet in a home. Some of these outlets will not be easy to access—an outlet behind a heavy dresser, for example. Because there may barely be enough room to reach the outlet, the test cable of the preferred embodiment shown in FIG. 3, wherein the adapter cable assembly is no bigger than a common extension cord, is clearly advantageous over that of FIG. 4, wherein provision of the circuits of the PCA are housed in a device adding bulk. Another more subtle reason for the preferred embodiment is that the load resistors in the PCA dissipate a lot of energy during continuous testing and therefore get quite hot, and the larger enclosure of the combined PCA/reel of FIG. 1 can accommodate a larger and therefore more effective heat sink. One final argument for the preferred embodiment of FIG. 1 is that the larger toolbox-styled PCA can be used to store adapter cables and the PCA during transport.

The physical design of the LCI 15 is also important to the ease of use and therefore the economic viability of SafeWire™ testing. The LCI 15 must be capable of being readily attached to a wide variety of Load Centers quickly and safely in order for the electrician to be able to test a typical home in a couple of hours. To this end, the LCI 15 is designed in a modular fashion that is adapted to temporarily attach to a Load Center and makes use of novel SafeWire Magnetic Probes, disclosed in detail elsewhere within this application, to make the temporary electrical contacts needed. These magnetic probes serve to conveniently attach sensing wires to each branch circuit by magnetic attachment to the steel head of the circuit breaker wire clamp bolts.

Figure 5:
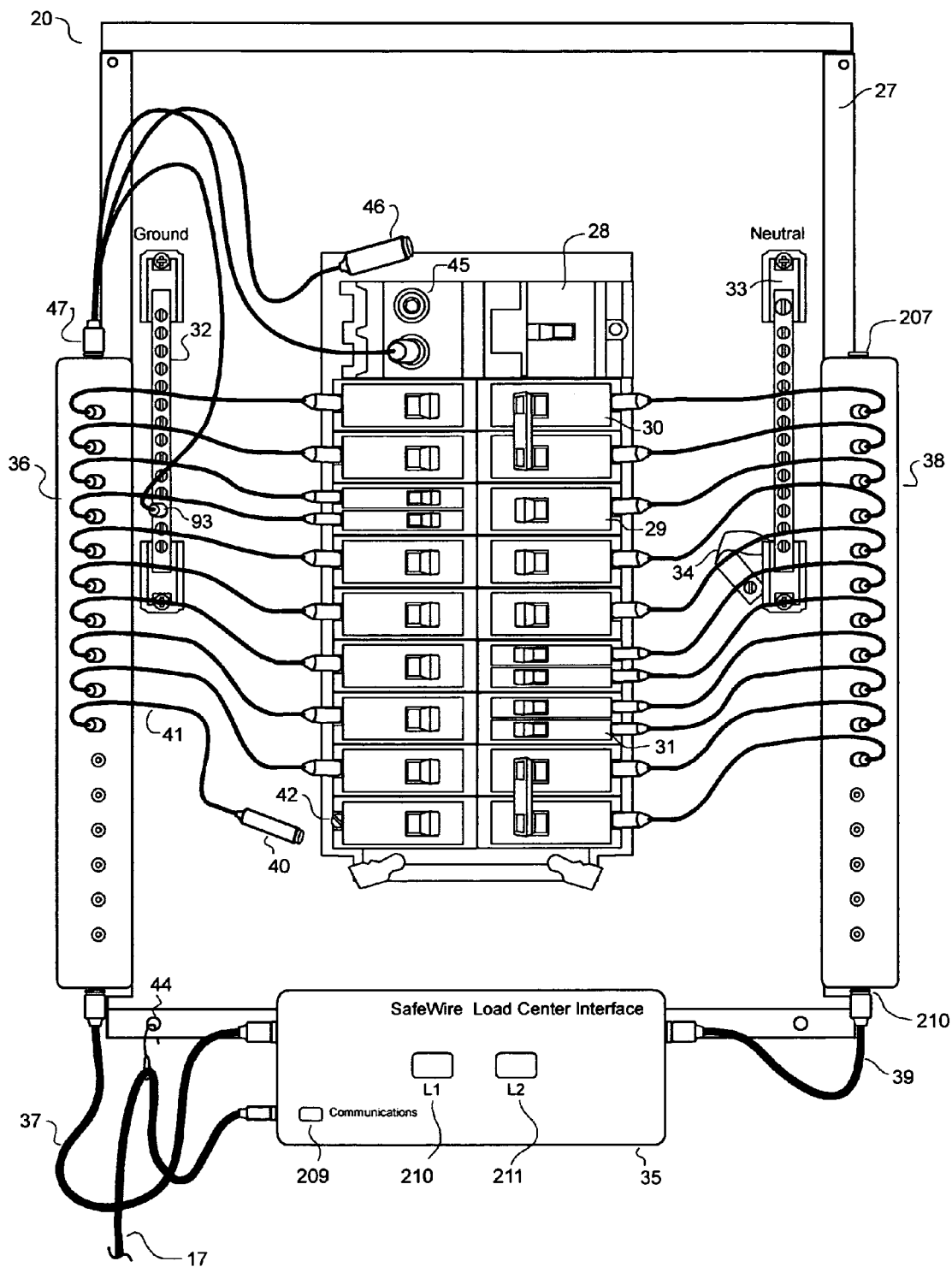
FIG. 5 is a drawing of a SafeWire™ Load Center Interface (LCI) module provided according to the invention, attached to a typical Load Center.

The preferred physical embodiment of the SafeWire™ Load Center Interface (LCI) 15 is shown in use, that is, temporarily attached to a typical household Load Center 20 in the illustration of FIG. 5. The Load Center 20 itself comprises an enclosure 27, a main circuit breaker 28, and a variety of branch circuit breakers including standard single-pole 29, double-pole 30 and half-wide 31 types. A Ground bus 32 and a Neutral bus 33 are also shown, the Neutral bus having an optional grounding strap 34 to connect Neutral to Ground. For clarity, the Load Center wiring itself is not shown. This type of Load Center is typical and the wiring and functionality of its components are well-known to electricians.

In the preferred embodiment illustrated, the LCI 15 comprises a Main Module 35, which clips on the bottom lip of the Load Center enclosure, and one or more Input Modules 36, 38 which stick to the metal flanges of the enclosure 27 via magnetic strips embedded in the back of the Input Modules. One Input Module 36 serves the left side and is plugged into the Main Module 35 via cable 37. A second Input Module 38 serves the right side and is plugged into the Main Module 35 via cable 39. Each Input Module accepts up to 16 Magnetic Probes, one for each circuit breaker pole. If the Load Center has more breaker poles than this, additional Input Modules can be stacked on each side by simply plugging them in to existing ones.

For each branch circuit in the Load Center, a probe wire 41 is first plugged into an input on an Input Module and then a Magnetic Probe 40 is temporarily attached to the wire clamp bolt 42 of the respective branch circuit breaker. The magnet in the probe is encased in an extended molded polymer probe which keeps the electrician's fingers away from the live terminals and makes it possible to attach the LCI to a "live" Load Center.

Power to the LCI and service feed sensing is obtained by attaching magnetic probes to the incoming service feed, conveniently accessed at the feed clamp-down hex bolts 45 in the main breaker 28. The magnetic probe 46 is shown spaced away from the hex bolt 45 for clarity. The diameter of this probe 46 is a bit larger than the other probes 40, to better fit the larger bolts and to prevent mistakenly attaching them to branch circuits, and is labeled accordingly. Although power could be fed instead into the main module 35, in this case it is conveniently fed into the expansion bus connector 47 on one of the Input modules.

The Main Module 35 contains a microprocessor that controls the operation of the LCI, connecting to each Input Module via the LCI bus and cables 37 and 39, and to the PCA through the umbilical cable 17. In the drawing of FIG. 5, the Main Module 35 includes voltage indicators 210 and 211 for each phase and a communications activity indicator 209. The umbilical cable 17 is provided with a strain-relieving support (shown simplified here, at 44) physically supporting it on the Load Center enclosure, and plugs into the Main Module 35. The strain relief 44 is needed to prevent disturbing the LCI 15 while the umbilical cable 17 is taken through the house.

The LCI with Input Modules connected, as shown in FIG. 5, has the ability to identify which branch circuit the PCA is plugged into, this information being used to document the system and produce a Load Center label or schematic diagram. In some cases this information is not needed and the Main Module 35 of the LCI can be used alone with the power cable 47 plugged directly into the LCI. SafeWire™ PCA testing can proceed as before, the only difference being that no information is gathered about which branch circuit the PCA is connected to.

Dielectric Testing using the Micro-Energy Dielectric Tester (µEDT) 18

Figure 6:
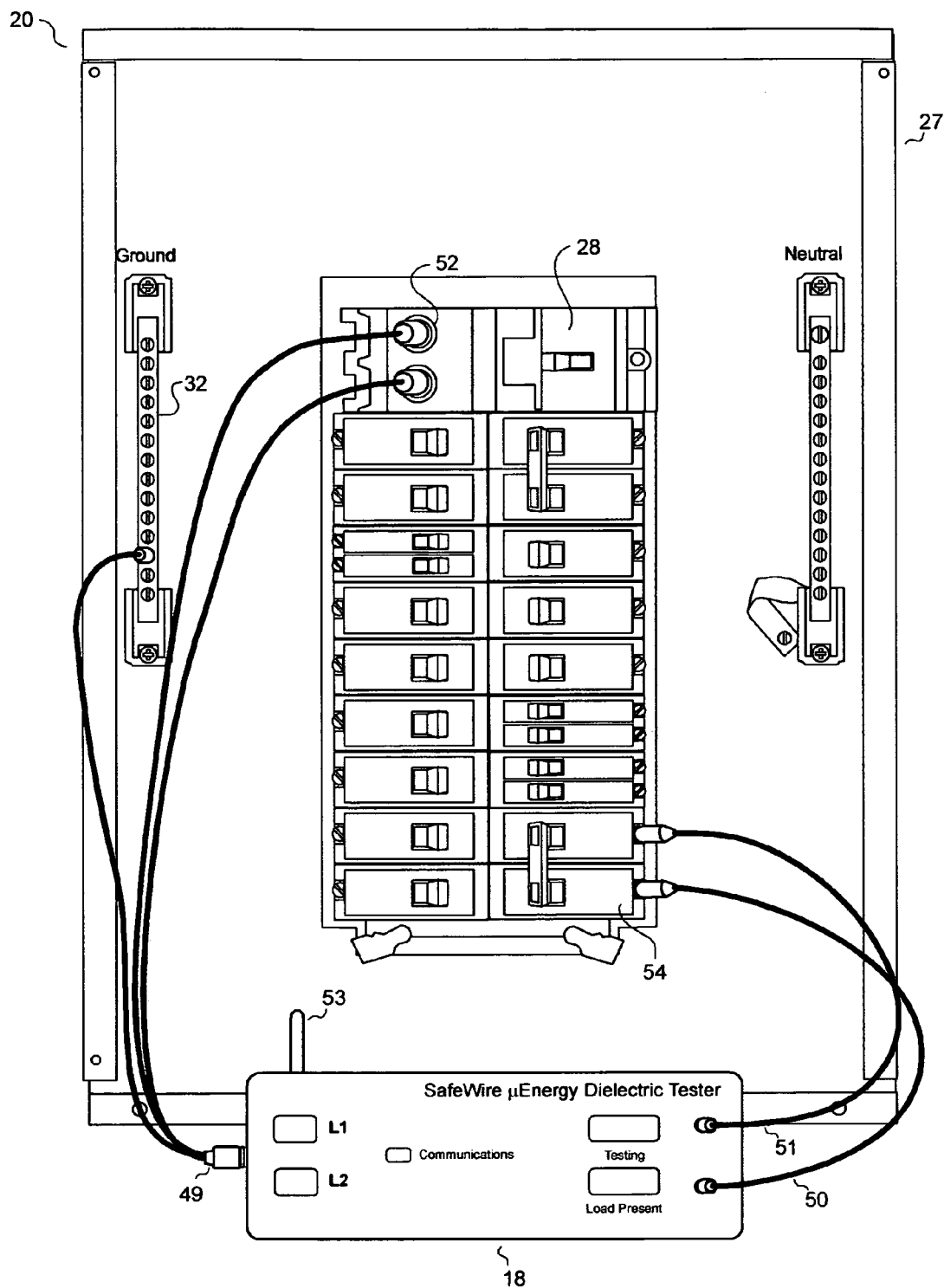
FIG. 6 is a drawing of a SafeWire™ Micro-Energy Dielectric Tester (μEDT) module provided according to the invention, attached to a typical Load Center.

The SafeWire™ System Micro-Energy Dielectric Tester (µEDT) 18 is shown attached to a typical Load Center enclosure 27 in FIG. 6. The method by which this testing is done is described in U.S. Pat. No. 6,777,953 issued to the present inventor. A low current, high compliance current source is connected across the line to be tested to charge the interwire capacitance to a high voltage (3,000V) over a short period of time (<1 sec). If any loads are inadvertently present, the low current source (5 µA) will not charge the wires to more than a couple of volts, the test will not be run, and the "Load Present" lamp will be lit, alerting the electrician to the situation. If no loads are present, i.e. nothing at all is plugged in, the voltage will ramp upward toward the full 3,000 volts. If a fault is present it will spark over once, with an energy level similar to the static discharge one may experience when walking across a carpet and then touching a metal doorknob. From this single discharge, the µEDT 18 can determine the distance to the fault, by measuring precisely the time between arrivals of the initial pulse and the first reflected pulse, as described in U.S. Pat. No. 6,777,953. This technique can be applied to a home Load Center by first turning off the Main Circuit Breaker and all Branch Circuit Breakers. The µEDT current source is then connected to one phase of the Load Center Bus, which at this point is not connected to anything. Then each Branch Circuit Breaker is turned ON in succession to test each individual circuit. This method places the µEDT 18 at the end of a transmission line formed by the cable of the branch circuit, a requirement of the method in order to produce valid reflected pulses from which the distance to the arc can be determined.

Again referring to FIG. 6, the µEDT 18 is clipped on to the bottom lip of the Load Center by means of an integral clip on the back of the enclosure. Power for the tester is derived from power cable 49 that uses magnetic probes 52 to attach to L1 and L2 on the input screw terminals of the Main Breaker 28 and Ground on the Ground bus 32 (L1 and L2 refer to Line 1 and Line 2, typically labeled Phase A and Phase B). In this manner, the μEDT 18 is powered even when the Main Breaker 28 is OFF. Test cables 50 and 51, which carry the outputs of the μEDT (one for each phase), must be connected to the L1 and L2 Load Center buses. This is conveniently accomplished by attached the leads 50 and 51, using magnetic probes, to two spare breaker poles, one on each phase. If a double-pole, 220-volt slot is available, then a two-pole breaker 54 can simply be plugged in and the two Dielectric Test cables 50 and 51 attached as shown. If two single-pole breaker positions are available, one on each phase, then the probes 50 and 51 can be connected to them. If no open positions are available, then it will be necessary to temporarily disconnect the load on one double pole breaker, the electric range for example, and then attach the magnetic probes 50 and 51 to that breaker.

As discussed previously, if dielectric testing is to be done, every load will have been left unplugged and all light circuits to be tested will have had each bulb unscrewed a couple of turns and the light switch left ON so as to enable dielectric testing of both the light socket and the wiring between the light switch and the light socket. This is most conveniently done during PCA testing. The specific test procedure is to first turn all circuit breakers OFF including the MAIN breaker, followed by attachment of the μEDT 18 to the Load Center as shown in FIG. 6. The PDA 1, which communicates with the μEDT 18 through a wireless radio link indicated by antenna 53, will then instruct the electrician to turn each branch circuit breaker ON in sequence. Within a couple of seconds after each breaker is turned ON, the test will be automatically completed, the PDA will instruct the electrician to turn it OFF and then turn ON the next breaker. If a load happens to still be present on the branch circuit switched ON, the PDA will so indicate and not test that circuit. If desired, the load can be found, unplugged and the test repeated. The Micro-Energy Dielectric Tester 18 is completely safe and non-destructive to any loads that might be on the circuit.

If a parallel fault is present the PDA 1 will display which two wires the fault is between and the distance from the Load Center to the fault. Since the PDA 1 already has a complete map of the household wiring, it can then indicate to the electrician precisely where the fault is, e.g., at outlet #3 in the Master Bedroom.

SafeWire™ Measurements

Wire Resistance—The system measures the source resistance of each wire at the adapter plug using the novel AC Balance Method of the present invention. Basically the PCA applies a rectified resistive load between either Hot and Neutral, or between Hot and Ground, causing about 10 amperes to flow and producing a voltage drop on each wire responsive to the current flowing though it. These individual voltage drops are determined by measuring the average DC value of the line voltage at the adapter cable. From these voltage drop measurements, the total source resistance of each wire can be calculated.

Load Center Source Impedance—The wire resistance measured above includes the impedance of the distribution transformer and the service feed line to the house. By measuring the shift in DC average of the line voltage input to the Load Center as the PCA applies the rectified load at the adapter, the source resistance of the Load Center can be determined. By subtracting this source resistance from the measured resistances at the adapter plug, the resistance of the wires from the plug to the Load Center (including the resistances of the Main Circuit Breaker and the Branch Breaker) can then be determined.

Circuit Breaker Resistances—The PCA applies the rectified load for about 1 second, which is 60 line cycles at 60 hz. There are two reasons for applying the load for so long. First, degraded contacts often exhibit a higher resistance only when heated so it is necessary to apply the load for a long enough time for the temperature to rise at the contact junction. Second, when the load is applied, the LCI measures the voltage drop across each Branch Circuit Breaker for the purpose of determining which Branch Circuit the load is on. The LCI measures the current over a single cycle and samples each breaker in sequence. Thus if the load is applied for 60 cycles, up to 60 breakers can be sampled.

Since the applied load current is substantially constant (fixed resistor), the voltage measured across the breaker will be proportional to the resistance of the breaker. In the preferred embodiment, the LCI samples at the input to the Main Breaker and at the output of each Branch Breaker, i.e., across the two breakers. Thus the measured resistance is the sum of the two breaker resistances. The small series resistance of a breaker is due to the bi-metallic trip element and is inversely proportional to the current rating and consequently the resistance of the Main Breaker (typically 200 amps) is much smaller than the branch breakers (typically 15 or 20 amps).

Finally, with the breaker resistance thus measured during a PCA load test, this resistance can also be subtracted from the measured resistance to determine the wire resistance from the adapter to the Load Center, and any abnormal or dangerous conditions brought to the attention of the electrician via the PDA 1.

Branch Circuit Number—As discussed above, the LCI scans all the Branch Circuit Breakers during a PCA load test and can therefore correlate the Branch Circuit into which the PCA adapter is plugged to the corresponding branch circuit. This information is then used by the PDA 1 to produce a list cross-referencing the branch circuits with the various appliance, rooms, fixtures and the like throughout the house, for future reference and troubleshooting.

Wire Lengths—The PCA measures the length of each wire from the adapter to the Load Center in the following manner. It sends a fast step pulse down the umbilical cable 17 to the LCI, which couples the pulse to the Load Center, sending it out in all directions. The PCA, knowing the fixed delay due to the length of the umbilical cable 17, starts to look for a pulse edge to arrive at the adapter at the end of this delay. On reception of the pulse edge, the PCA measures the time delay from when it initially sent the pulse down the umbilical cable. Since the "Romex" cable typically used for residential wiring acts as a transmission line with a consistent propagation velocity, the length of the wire can be determined from the measured delay.

Wire Gauges—With the resistance of the wire and its length known, the PDA can calculate and report the gauge of each individual wire. When there is excessive resistance on one wire due to a bad connection, for example, the system can sort it out by taking the lowest of the three wire resistances to estimate the gauge. More specifically, if the three wires on a grounded outlet are presumed to be the same length, and one of the three wires exhibits a resistance under load that is higher than the other two, the system can surmise that a connection on that wire is the cause of the increase in resistance, and therefore use the lowest resistance wire to estimate the gauge.

Arcing—The LCI employs a swept radio-frequency arc noise detector connected to the Load Center that monitors the entire house for the presence of arcing. U.S. Pat. Nos. 5,729,145, 5,223,795, 5,434,509, and 5,223,795, all issued to the present inventor, relate to the detection of arcing by monitoring high-frequency emissions. One of the requirements of involved in differentiating arcing from other conditions is the differentiation of RF noise, from radios, lamp dimmers, and the like. Since the electrician has control of the house during SafeWire™ testing, most loads will be turned off, keeping background RF noise to a minimum.

During PCA load testing the LCI monitors for the presence of arcing while the load is applied. In this case, extraneous impulse noise from lamp dimmers and the like is further minimized by the principal of time-interval filtering, i.e., sampling for arcing only during the short interval when the load is applied.

The normal arc that occurs when a light switch is turned ON or OFF is also monitored by the LCI. The duration of the arc is displayed on the PDA and the electrician is notified if it is too long, indicating that the switch is old and should be replaced.

Appliances and other electrical devices can also be tested for excessive arcing. The electrician simply plugs the device in, sets the PDA to monitor arcing and then turns the device ON and OFF, and perhaps run the devices through its various operational modes.

Dielectric Breakdown Voltage—As discussed above, the µEDT 18 measures the breakdown voltage between Hot and Neutral or Ground on unloaded Branch Circuits and, if a breakdown occurs, reports the wire length from the Load Center to the fault. Since the PDA has a complete map of the household wiring, it can then locate the fault precisely.

Correct Outlet and Light Fixture Wiring—The PCA has circuits to analyze the wiring of outlets and light sockets and can report directly if they are wired incorrectly, and can also tell the electrician precisely how to fix it.

Ground Fault Circuit Interrupters (GFCI)—The PCA can switch a 5 milliampere load resistor (or any other value) from Hot to ground to test the functionality of installed GFCI's.

Arcing Fault Circuit Interrupters (AFCI)—The PCA can be programmed to switch test loads in and out in a chaotic pattern to test some AFCI's.

Extension Cord Testing—An extension cord can be tested for arcing, individual wire resistances and breakdown voltage by plugging it into a previously tested outlet and informing the PDA of the presence of the cord. This facility is particularly relevant to extension cords installed in a semi-permanent manner, which may be undersized and can become dangerously degraded over time.

Appliance and other Metal Surface Grounding—A simple probe would test the ground resistance of switch plates, appliances and the like, to determine whether they are correctly grounded or not.

As described above, the PCA ground test probe can be used to quickly test painted or unpainted metal surfaces to determine if they are grounded. The probe also determines whether the surface has a proper separate ground path home.

SafeWire™ Documentation

SafeWire™ testing enables an individual electrician to test every electrical wire, every connection, every outlet, every switch, every light, and every appliance in a house, typically in a few hours or less. Each test provides the length and resistance of each wire from the receptacle to the Load Center, the voltage on each wire, the branch circuit number, etc., the data typically including hundreds of measurements or more. Most of this data need not even be seen by the electrician because the SafeWire™ system automatically qualifies the data pointing out the electrician only abnormal measurements or anomalies that require her attention. This complete set of data, however, is useful for a number of purposes, and is therefore automatically compiled and saved by the system in what the present inventor refers to as the SafeWire™ Data Tables. These Data Tables are preferably saved in a standard spreadsheet format, such as Microsoft Excel, so that they may be conveniently accessed by either the electrician or the homeowner. Furthermore, the SafeWire™ Data Tables can be conveniently saved onto a small memory card, preferably one that can be written to and read from by the PDA such as the commonly-available SD memory card or its equivalent, and the card left in a small paper pocket on the inside of the Load Center door, for example.

In accordance with the present invention, the information saved in SafeWire™ Data Tables can be used to generate a Load Center Label that can be printed directly onto special magnetic "paper" and then conveniently stuck to the metal door of the Load Center. Magnetic "paper" that can be printed on in a standard inkjet printer is readily available from a number of commercial sources. The Load Center Label can be made to list the number and types of lights, outlets, and even the names of specific loads, e.g., refrigerator, on each branch circuit breaker. The information in SafeWire™ Data Tables can be further used to generate a schematic diagram of the house including the lengths of each wire. To do this a computer, either the PDA or a separate desktop computer, processes the raw data which including all measured wire lengths, to generate a complete schematic diagram of the installation, noting or resolving any ambiguities that arise. Finally, the SafeWire™ Data Tables can be used to advantage to run Aging Wiring Comparison Reports, whereby an electrician can quickly and conveniently compare the results of current SafeWire™ testing to that of previous SafeWire™ testing recorded on the memory card, the report automatically pointing out the differences. This may be of particular value in testing museums, hospitals and other high-value electrical wiring installations.

2. The SafeWire™ Portable Circuit Analyzer (PCA)

The SafeWire™ Portable Circuit Analyzer or PCA 2 is a portable unit with a handle on top designed to be carried by an electrician throughout a home to test outlets, light fixtures, appliance grounds, and other elements of the electrical system of the house. In the preferred embodiment of FIG. 1, as discussed above, the PCA carries the umbilical cable 17, a thin coaxial cable stored on a retractable reel that connects the PCA 2 to the Load Center 15 of the home. As the electrician walks from room to room, he unreels the cable 17 from the PCA, places the PCA in a convenient location (typically on the floor), and then connects, for example, a short cable with the appropriate adapter to plug into the outlets to be tested. The electrician controls the tests and views the results on a specially-programmed handheld PDA 1, which communicates with the PCA 2 via a built-in Bluetooth radio link.

A simplified schematic diagram of the PCA 2 is shown in FIG. 7. An adapter connector 55 is disposed to accept a variety of adapter cables that plug into specific outlet types. One such adapter cable 56 adapts the PCA to a standard grounded 3-prong outlet 57. Identification resistor 58 is used by the system to identify the type of adapter plugged in. A second adapter cable 59 is configured to connect to an older 2-prong outlet 60 and also includes an identification resistor 61. Note that in this case no connection is made to the Ground terminal on the adapter. A third adapter cable example 62 connects to a standard 4-prong 220V appliance outlet 63 and again contains an integral identification resistor 64. Many more types of adapters can be used to interface to other types of outlets or other points at which circuit testing is appropriate, such as lamp sockets; in that case, a spring-loaded device adapted to be inserted into the lamp socket (i.e., without requiring the electrician to thread a connector into the socket) might usefully be provided.

The PCA employs a microprocessor 76 to control load switching and take various measurements. The PCA communicates with the handheld PDA via RF link 92 that feeds antenna 11 (antenna 24 in FIG. 8). Control lines 94 control the exchange. A wireless link is advantageous because a number of the desired suite of SafeWire™ tests are stimulus-response tests, wherein the electrician monitors the response (with the PDA 1 held in one hand) while initiating the stimulus with the other, for example, he may switch a light switch on and off while observing the duration of the arcs produced. Or he may physically tap a lighting fixture while monitoring the display on the PDA for the presence of arcing. Since a number of commercially available PDAs contain an integral Bluetooth radio, such as the Palm Pilot Tungsten series, inclusion of a radio data transceiver in the PCA allows the electrician to conveniently view test results on the Palm Pilot in one hand, while simultaneously executing tasks with the other, such as switching light switches ON and OFF.

An umbilical cable 17 is used to connect the PCA 2 to the LCI 15 at the Load Center of the home. Conveniently, the umbilical cable 17 is stored in a retractable reel comprised by the PCA 2. The umbilical cable 17 comprises a coaxial cable including a single conductor 89 and an overall shield as indicated at 88. The shield 88 at the other end of the umbilical cable connects to the circuit ground 91 of the LCI which, when attached to the Load Center, is connected to the household Ground. The umbilical cable 17 serves a number of purposes simultaneously. Low-voltage DC power from the LCI 15 is transmitted down the umbilical cable 17 to power the PCA 2. Although power for the PCA could be obtained from the outlets that it is plugged into, this would mean that the PCA is only powered when plugged in. It is advantageous for the PCA to be constantly powered, so that communications with the PDA can continue, for example while the outlets are depowered, and therefore power is supplied down the umbilical cable 17. The second function served by the umbilical cable 17 is that the shield 88 comprised thereby connects the PCA circuit common 90 to the Load Center ground 91, thus providing a voltage reference for outlet measurements. A third use of the umbilical cable 17 is that it provides a bi-directional communications link between the PCA 2 and the LCI 17. While this too could have been provided by a radio link, there are substantial advantages to using a hard-wired link. The electrician and the PDA will always be near the PCA, typically within 10 or 15 feet, and so a Bluetooth link with a minimal range of 30 feet is acceptable for this communication facility. But the Load Center is commonly much farther away, typically in the basement and in the case of apartment buildings, for example, perhaps several floors and one or more cement walls away. It is therefore advantageous to have a secure, hardwired link between LCI 15 and PCA 2. A further use of the umbilical cable 17 is as a high-speed conduit for the digital pulse used to measure the length of wires in the house. For this reason, the umbilical cable 17 is coaxial cable with well-defined impedance and loss characteristics. The interface and switching circuits to multiplex these various functions, labeled UI for Umbilical Interface, are shown as 85 in FIG. 7. The microprocessor 76 controls the circuits through control lines 87.

The microprocessor 76 measures voltages on the four adapter lines 65 using four Multi-Function Interface modules 69, which are configurable devices controllable by the microprocessor 76 via control lines 68 to perform different basic functions depending on what measurement is desired to be taken. Each MFI 69, for example, can be configured to serve as a resistive divider, a resistance measurement circuit or a Low-Pass Filter (LPF). It is a relatively simple matter for one skilled in the art to adapt the Multi-Function Interfaces to switchably perform these functions and therefore the circuits are not described in detail here. Four current-limiting resistors 67 serve to sample the current on the corresponding line; each resistor 67 is of a high enough value to limit the current to milliamp levels that can be easily clamped and thereby allow low-voltage switching means to be used to change circuit configurations.

In a typical test sequence, the first task of the PCA is to configure two of the four Multi-Function Interfaces 69 to measure the value of the identification resistor (e.g., 58, 61 or 64) before the adapter plug (e.g., 57, 60 or 63) is plugged into an outlet. If infinite, no adapter cable is plugged in. All other values correspond to a particular adapter type allowing automatic identification by the PCA.

The second basic task is to verify that the wiring of the outlet or socket is correct. The PCA configures the MFIs to form simple voltage dividers with resistors 67 to measure the voltages present on each of the four lines 65. Using this data the PCA can detect when the adapter has been plugged in, and whether the socket under test is correctly wired. If a wiring error is detected, the electrician is informed of it directly on the PDA and given instructions on how to correct it.

If the PCA is to be used to test a GFCI (Ground Fault Circuit Interrupter) protected outlet, the electrician so indicates on the PDA, so that the PCA is advised, in effect, that a different test is required than testing of an ordinary outlet, although the same adapter cable 5 will be used. The PCA can test the GFCI by applying a resistor $R_G$ between either L1 or L2 and ground, the test leakage current being set by the value of $R_G$. Switch 129 applies test resistor 131 between L1 and ground and switch 128 applies test resistor 130 between L1 and ground. Since the ground used is the PCA circuit ground, which is connected to the Load Center ground via the umbilical cable 17, ungrounded (2-wire) GFCI protected outlets can be tested. Finally, by monitoring the voltage on L1 or L2 (through resistors 67) as $R_G$ 130 is applied, the GFCI trip time can also be measured.

The third test to be performed by the PCA is to measure the length of the wires from the Load Center to the outlet under test. Detailed discussion is provided in Section 6 below entitled "Least-Time Propagation Method". The process is generally as follows. First the microprocessor 76 applies a pulse with a fast leading edge to umbilical cable 17 via a fast line driver in the umbilical interface 85, selected by control lines 87. The output impedance of the driver should match the characteristic impedance of the umbilical cable 17. The leading edge of this pulse will travel down the fixed length umbilical cable 17 to the LCI, where it is coupled to the line between L1 or L2, as required, and G and N which are tied together there. The PCA, knowing the length of the umbilical and hence the delay before the pulse can arrive, waits that amount of time and then starts a constant input integrator 73, so as to begin timing the transit time and enables a programmable threshold detector (PTD) 71 to begin looking for the pulse. When the leading edge of the pulse reaches a high-frequency coupling unit 66 connected to each of the wires 65 connected to the conductors of the socket under test, it is coupled to the PTD 71 which trips and stops the integration, holding the value until the microprocessor 76 is able to read it. If no pulse is detected within a preset period of time, equal to the time required for the maximum expected wire length, the PTD 71 is disabled and an error noted. The threshold of the PTD 71 is desirably set to the lowest threshold that does not cause excessive false tripping. On success, the same measurement can be repeated several times to be sure it is repeatable and therefore indicates a reliable result.

The fourth basic function performed by the PCA 2 is that of load testing each of the four lines 65 to measure the source resistance of each line using the present invention's AC Balance method. This process is detailed in Section 5 below entitled "AC Balance Method". The following summary is provided here to allow more complete understanding of the PCA 2. First, the MFIs 69 are configured to form four low-pass filters. Each of these filters should be a 3-pole Bessel filter with a cutoff frequency of about 0.16 hz. Switches 81 and 82 allow the microprocessor 76 to insert load resistor 83 between L1 and N or between L1 and G respectively. Rectifier 84 allows current to flow through load resistor 83 only during positive half-cycles of L1. Similarly, switches 79 and 80 allow the microprocessor 76 to insert load resistor 78 between L2 and N or between L2 and G respectively, and rectifier 77 restricts the current to positive half-cycles of L2. As described in Section 5 below, each switch is closed in sequence to allow rectified current from either L1 or L2 to flow to either Ground or Neutral or both. The average DC voltage at the output of each low-pass filter is measured and from these readings the resistance of each line is calculated. The resistances from these measurements are the total source resistance feeding the outlet and therefore can be used to determine the total current capacity of each outlet, assuming the NEC standard 3% maximum voltage drop. As this data is collected for each wire on each outlet, it is stored in tables in the PDA for later compilation and reporting.

As noted, the PCA 2 operates by applying a load across different combinations of lines 65 and measuring the voltage drop produced along those lines using the AC Balance method. Both the size of the load and the duration over which it is applied are important considerations. As contacts deteriorate, the current is gradually restricted to very small cross-sectional areas, which heat up in proportion to the square of the current flowing. For this reason, to expose such connections the test load current must be relatively high, on the order of 10 amperes for typical household wiring. The duration of time that the load is applied is also important because it takes time for these restricted bridges to heat up. Testing by the present inventor has shown that the load should be applied for about one second to reliably reveal deteriorating connections.

If other loads happen to be present on the line, there may exist a voltage drop on any one of the lines before any of the switches 79–82 are actuated. Also, since the typical signal levels to be measured are millivolts, circuit component offsets may also contribute to the unloaded offset. For both reasons, an improvement in the AC Balance measurement procedure is to first measure and record the average DC voltages on each of the four lines. After the loads are switched on and voltage measurements taken, these initial offset voltages are subtracted from the readings, thereby correcting for initial offsets.

It will be noted that while the purpose of the PCA 2 is to measure the resistance of the wires feeding the outlet under test, the additional resistance of the four wires in the test cable 5 that extends from the outlet to the point at which the sense resistors 67 are tied, and the contact resistance of mating test connectors 55, 56 of that cable assembly, will also be measured. Since the resistances of these wires and the connector are known and constant (presuming use of a good quality connector), the PCA can simply subtract these known resistances from the measured resistance values to compensate.

An alternative and more accurate means to compensate the test lead resistance is to run both a current-carrying wire and a smaller gauge sense wire from the PCA all the way through the connector that plugs into the outlet under test. This configuration is illustrated in the schematic of FIG. 8. As shown, each sense resistor 67 now feeds a separate wire that runs all the way through adapter connectors 55 and 56 to test connector 57. In this manner, the wire resistances of the test cable 65 and the contact resistances of the adapter connectors 55 and 56 are accurately compensated for. This method, commonly known as the 4-wire resistance measuring method, is well known and made use of in commercially available low-resistance measuring instruments.

One useful purpose of using the AC Balance method to measure wire resistances under load in the SafeWire™ system is to identify and locate undersized wires. Since the PCA is capable of measuring the actual wire length and its resistance, it becomes a simple matter to calculate the gauge of the wire. The AC balance method disclosed so far, however, measures the total source resistance as seen at the outlet, which includes the wire resistance from the Load Center to the outlet, the branch circuit breaker resistance, the Main Service Breaker resistance, the resistance of the Service Feed cable and the source resistance of the residential Distribution Transformer. There exists a need, therefore, to determine the actual resistance of the wires from the outlet to the Load Center.

The SafeWire™ system makes use of two more novel methods to separate these resistances. Because part of the circuitry employed to this end is contained in the LCI module attached to the Load Center, it is now necessary to make some reference to the SafeWire™ system as a whole. FIG. 9 shows a simplified schematic diagram of the AC Balance portion of the PCA 2 plugged into a 220-volt outlet 114 on a household wiring system. This could of course be any other type outlet or lamp socket instead of the 220-volt outlet shown. A second outlet 115 on the same branch circuit has nothing plugged into it. A Residential Distribution Transformer 105 feeds through a Service Entrance (not shown) to the Main Breaker 108 in the Load Center 107. The branch circuit shown is protected by Branch Circuit Breaker 110. Other branch circuits (also not shown) feed off of lines 109 and 112 in the Load Center. In accordance with accepted NEC standards, the Load Center is connected to an Earth Ground Rod 111 and the Ground and Neutral busses are bonded together at point 113. The Distribution Transformer 105 typically has a separate Earth Ground Rod 106 located in the vicinity of transformer 105.

The Load Center Interface (LCI) 15, described in detail in Section 3 below entitled "SafeWire™ Load Center Interface", is electrically attached to the Load Center at various points. An umbilical cable 17, between the PCA 2 and the LCI 15 serves to connect the circuit ground 90 of the PCA to the circuit ground 91 of the LCI and to allow the microprocessor 76 in the PCA 2 to communicate with the microprocessor 121 in the LCI 15.

Three wires from the LCI 15 attach to the Load Center to both supply power to the LCI (power supplies not shown) and to sense the incoming power lines. Two of these attach to the input screw terminals of the Main Breaker to sense L1 and L2 through current-limiting resistors 117 and 116 respectively, and a third connects the LCI circuit ground 123 to the Neutral bus. All three connections are made safely and conveniently using novel magnetic probes as described in Section 4 below, entitled "SafeWire™ Magnetic Probe." Microprocessor 121 in the LCI measures voltages on L1 and L2 using two Multi-Function Interface modules 118 and 119, which as in the PCA are configurable devices controllable by the microprocessor 121 via control lines 122 to perform different basic functions depending on what measurement is desired to be taken.

As will be recalled from the previous discussion of the AC Balance Method and as discussed further in Section 5 below entitled "AC Balance Method", the PCA 2 applies a rectified load resistor across various combinations of lines and measures the voltage developed on those lines, from which data the resistance of the lines can be determined. The resistance of each line is the total source resistance for that line, including the wire resistance from the outlet under test to the Load Center, the branch circuit breaker resistance, the Main Service Breaker resistance, the resistance of the Service Feed cable and the source resistance of the residential Distribution Transformer. By measuring the shift in DC average at the input to the Main Breaker (by configuring the MFIs 118 and 199 as low-pass filters in the same manner as in the PCA described above), at the same time that the rectified load is applied at the outlet 114, the LCI 15 can now determine the total source impedance feeding the Load Center, including the impedance of the distribution transformer 105 and the service feed line. Since the voltages are measured independently on L1 and L2, the source resistance of the two phases can be determined independently of each other. From this data, the LCI can readily calculate, based on the accepted NEC standard of a 3% maximum voltage drop, the service capacity of the house in amperes (typically 100–200A). Because the impedance of the Service Feed will be an order of magnitude or so lower than the resistance of wires on an individual branch circuit, it is advantageous to make the low-pass filter configuration of Multi-Function Interfaces 118 and 119 more sensitive to DC level shift than the ones incorporated in the PCA.

Thus the first novel method to separate the resistances is to measure the Service Feed impedance to the house and subtract it from the total measured impedance. For maximum accuracy, this can be done every time an outlet or lamp circuit in the house is load tested. At this point, the corrected resistance of a wire measured by the PCA still includes the series resistance of the Branch Circuit Breaker and the Main Circuit Breaker. A separate feature of the LCI can be used to measure the series resistance of the Main Breaker and each Branch Circuit breaker individually. With this last piece of data, the LCI can determine what the wire resistance is from the outlet under test to the Load Center, and using the measured length of the wire, calculate the wire gauge.

As described in detail in Section 3 below, entitled "SafeWire™ Load Center Interface", the LCI measures the voltage drop across each of the branch circuit breakers in order to identify the branch circuit to which the outlet under test is connected. All circuit breakers of the type used in residential wiring have a thermal element that heats up and bends when more than a predetermined amount of current flows through it; a mechanical device then opens the circuit. The reason the internal bi-metal element heats up is that it has a resistance, albeit only on the order of milliohms, but this is enough for the LCI to detect load currents as low as an ampere or less. Thus one major function of the LCI, identifying which branch circuit the outlet under test is on, is accomplished by looking for a voltage drop across one of the branch circuit breakers when the rectified load is applied during load testing. Since the load current, being determined by the load resistance $R_{L1}$ or $R_{L2}$ is substantially constant, the voltage drop across the breaker is proportional to the series resistance of the breaker.

In fact, in accordance with FIG. 9, the resistance that will normally be measured in this fashion is the series resistance of the Main Breaker plus the series resistance of the Branch Breaker selected. The reason for this is simply that it is inconvenient to access the internal buses of the Load Center with the magnetic probes, which would be necessary in order to make these connections "downstream" of the Main Breaker. Having the Main Breaker in the circuit makes little difference because the series impedance of the Main Breaker is an order of magnitude less than the series resistance of a branch breaker.

The purpose for measuring the series resistance of the breakers is twofold. First, a common failure that sometimes leads to house fires is arcing at the press-on tab contact on the back of branch circuit breakers. If a tab has been arcing it will exhibit a higher contact resistance under load and thus be revealed with this test (the radio-frequency noise of any arcing that occurs will also be detected by the LCI, see Section 3 below). The second reason is that the contacts inside an aged circuit breaker may deteriorate to the point that they begin to arc. This too would be readily revealed by a higher than normal series resistance under load.

Returning to discussion of the circuit of the preferred embodiment of the PCA 2 shown in FIG. 7, a SafeWire™ Multi-Sensor Probe interface is provided, including connector 95. This interface is included to support a variety of small hand-held sensors that can be used to advantage by the electrician while testing. A simple Ground Safety Probe, for example, using conventional resistance measuring circuits can test the resistance between metal surfaces on switch plates, appliances and the like, and Ground at the Load Center (using the umbilical cable reference). An infrared temperature-sensing probe could be used by the electrician to sense spot temperatures at light fixtures. A contact temperature-sensing probe might also be useful. It is often advantageous with sensing probes of this type to place the low-level analog circuits at the probe itself and, for this reason, a generic sensing probe interface is provided.

In FIG. 7 a generic sensing probe is shown in simplified schematic form. The probe assembly, located at the end of a convenient length of cable, comprises a number of generic elements. The output of sensor 97 is conditioned and amplified by analog circuits 98 to feed the line marked S (Sense) on connector 96. Power to the probe is provided by the V(Voltage) and G(Ground) lines. Provisions are also included to allow the PCA to automatically identify what type of sensor module is plugged in. The line marked I (Identification) on connector 96 is fed by a resistive divider formed by resistor 100 and resistor 101. By assigning the value of resistor 101 in accordance with the sensor type, the voltage on line I can be read by the microprocessor 76 to identify the probe. This same line can be used to determine whether any probe is plugged in (the voltage on line I will be at V+ when no probe is plugged in) and to initiate a measurement by pressing normally open switch 102 (the voltage on line I will be 0 when switch 102 is pressed). One or more LED indicators 103 may be included to provide a Pass/Fail visual indication to the electrician at the probe.

The simple Ground Safety Probe discussed above can usefully employ another novel method of the present invention to determine whether a separate ground return path is present as required by most current electrical codes. For well-known safety reasons, modern grounding standards dictate that no current should normally flow through a protective ground wire. The method comprises first measuring the resistance between the grounded surface and the Load Center Ground and, thus established, monitor the voltage on the grounded surface as the associated load is turned ON. For example, if the load is a dishwasher, touch the probe to an exposed metal surface, measure the ground resistance and then momentarily turn the dishwasher ON. If this voltage rises responsive to load current, it reveals that the load current is flowing, at least in part, in the Ground wire. On a correctly grounded dishwasher, the load current will flow back through the Neutral wire and no voltage will be seen on the Ground.

Finally, the PCA may also be used to test extension cords, outlet strips and the like. Once the PDA has determined the source impedance of an outlet, as described earlier, an extension cord, for example, can be plugged into the outlet and the PCA then plugged into the end of the extension cord with the appropriate adapter. The electrician informs the PDA of the extension cord and the system then calculates the resistance of each wire in the cord by simply subtracting the source resistance of the outlet from the total measured resistance on each wire.

3. Safe Wire™ Load Center Interface (LCI)

The SafeWire™ system Load Center Interface or LCI 15 attaches to the Load Center in a home and serves to monitor various parameters as the electrician moves throughout the home testing outlets, appliances, switches and light circuits with the PCA. The LCI is an expandable modular unit designed to be easily, safely and quickly attached and removed from a Load Center using a variety of magnetic attachment means including a novel Magnetic Probe design (see Section 4).

A simplified drawing of the LCI 15 as attached to a typical home Load Center is illustrated in FIG. 5, and the physical aspects of the connection scheme employed were discussed above.

One purpose of the LCI 15 in the SafeWire™ system is to determine which Branch Circuit the PCA 2 is connected to as the electrician moves throughout the house, testing outlets and light circuits. To accomplish this the LCI 15 must be able to identify each breaker by position, and to measure the current individually flowing through each breaker (and, in order to support the PCA's function of providing a Load Center label and a printed circuit diagram of the house, the LCI must able to communicate this information to the PCA via umbilical cable 17). While both magnetic and Hall effect clamp-on AC current sensors are readily available, they are generally too large and too expensive to be practical for simultaneous connection to every breaker in a Load Center. If a custom clamp-on current sensor could be developed that is inexpensive, very small and made to clamp tightly on to 8–14 gauge wires, it could serve the current purpose well and is thus considered to be within the scope of this application. The method disclosed herein, however, is much less expensive and much more practical than magnetic current sensing and therefore better suited to the need.

The novel method of the present invention is to sense current flow through the breaker by measuring the voltage drop across it. The inventor, noting that all home breakers contain an integral thermal trip element, which by its nature exhibits a small resistance (the resistance of the bi-metal trip element is what causes the element to heat up in response to excessive current and therefore bend, tripping the breaker), realized that the small voltage produced across the breaker could be used to sense current flowing through it. Furthermore, since the PCA applies a substantially constant-current load during testing, the measured voltage across the breaker can be used to calculate the resistance of the breaker. Tests by the present inventor have shown that currents as low as 1 ampere can be measured accurately using this method.

Electrical systems built before circuit breakers were commonly available usually employed fuses of various types. The current sensing method just described also works with fuses because fuses too are thermal devices whose current interruption mechanism is based on the heat generated by the current flowing through the fuse element's resistance. Power distribution systems that employ fuses instead of circuit breakers, in part or in total, such as found in old houses for example, represent a valuable potential market for SafeWire™ testing. It is therefore to be understood that in the context of this application the term "circuit breaker" shall include fuses of all types.

Load Centers may be configured as Main Service Panels or Sub-Panels and come in a variety of types and sizes, ranging from just a few branch circuits to forty or more. Temporary connections need to be made to every Branch Circuit Breaker terminal and to the incoming power lines. The modular design of the LCI of the preferred embodiment of FIG. 5 makes it quick, safe and easy to interface to a wide variety of Load Centers. It is to be understood that other packaging methods and modular interconnect designs may also work and are within the scope of this invention.

Referring again to FIG. 5, attachment of the LCI 15 to the Load Center 20 may proceed generally as follows.

First remove the cover of the Load Center 20 and set it aside. Then clip the Main Module 35 on to the lower lip of the Load Center enclosure 27. Starting on the right side, stick (by means of an integral magnetic strip on the back of it) an Input Module 38 to the exposed metal flange of the enclosure 27, and position it so that the top is near the top Branch Circuit Breaker. The Input Module 38 shown has 16 input jacks on the front and can therefore be connected to up to 16 circuit breakers. If the Load Center has more than 16 breakers on the right side, then another Input Module (not shown) can be simply placed above or below the first module 38 and plugged into it to increase the total number of inputs to 32. Each Input Module has a connector on the top and the bottom, and the internal control bus is arranged so that they can be daisy-chained in this manner. A control cable 39 attaches the bottom of the Input Module 38 to the Main Module 35. Now repeat this procedure on the left side of the Load Center.

Next attach sensing wires to each breaker. Starting on the top left, plug a SafeWire™ Magnetic Probe Sensor Wire (detailed below) into the top input jack and then stick the Magnetic Probe to the head of the screw terminal on the first branch circuit breaker. An unattached magnetic probe 40 on sensor wire 41, which connects to circuit breaker screw 42, is shown for reference. Proceed down the left side to attach each successive circuit breaker pole to its corresponding input. If a breaker pole position is empty, skip that input jack. Proceed in the same manner down the right side of the panel.

Power to the LCI is provided by the Power Input Cable 47, which is shown in schematic form in FIG. 13. The connector 173 plugs into the end of any Input Module to supply power to the entire system. The Magnetic probes for L1 (174) and L2 (175) are physically designed to be suitable for attachment to the input lugs of the Main Breaker and are therefore somewhat larger than the Branch Circuit Breaker probes. Similarly, the ground probe 175 is adapted in size to be suitable for attachment to a screw on the ground bus bar.

Thus, with all Branch Circuit Breakers connected, plug a Power Input Cable 47 into the top of one of the Input Modules, in this case Module 36, and first stick ground probe 93 (preferably color-coded green) to the top of one of the screws on the Ground Bus Bar 32. Next, carefully stick the black L1 probe 46 to one input terminal 45 of Main Breaker 28. Since the terminal is live, the corresponding L1 light on the Main Module 35 will illuminate. Carefully stick the red L2 probe to the other incoming terminal of Main Breaker 28, and light L2 will illuminate. Finally, plug the umbilical cable 17 into the Main Module. The LCI installation is now complete.

The system is designed so that the LCI 15 can be safely attached by an electrician to the Load Center 20 while the Load Center is live, i.e., while the Main Breaker 28 is ON. The SafeWire™ Magnetic Probes are fully insulated and long enough so that the electrician's fingers need not come near the live terminal. The magnetic probe sensor wire should always be plugged first into the Input Module and then stuck to the live terminal on the breaker instead of the other way around. SafeWire™ Magnetic Probes are also each internally fused at a very low current level for added protection. If desired, for safety, the Main Breaker can be turned OFF during installation.

Referring now to FIG. 10, the basic measurement method of the present invention is shown in simplified schematic form. As discussed above, the typical Load Center 53 is fed by a Service Feed from a distribution transformer 105, which is typically grounded to Earth via a grounding stake 106. Three power lines, L1, Neutral and L2 feed the Load Center 53 through a Service Entrance with L1 and L2 connected directly to a two-pole Main Breaker 108 and the Neutral line connected to a Neutral Bus Bar in the Load Center. A Separate Ground Bus Bar in the Load Center is connected to the Neutral Bus Bar at 113 and both are connected to local Ground Stake 111. The output of the Main Breaker 108 feeds buses that allow connection of a number of Branch Circuit Breakers, some from L1 (134) and some from L2 (135).

The LCI 15 generally comprises a voltmeter on each phase, capable of measuring the small voltage that develops across each circuit breaker when current flows through it, and a switching network to connect each voltmeter across any selected Branch Circuit Breaker. The voltmeter 137 on L1, for example, has one end connected to the incoming L1 (138) and can be connected through switches 139 to any one of the Branch Circuit Breakers 134 on L1. In operation, the microprocessor (not shown here) continuously sequences through these switches to measure the voltage across each breaker. Ground symbol 91 represents the circuit ground of the LCI.

In FIG. 10, the voltmeter 137 is connected to the input side of the Main Breaker at 138. It is connected here because this point is easily accessible for the magnetic probe on the input lugs of the Main Breaker. Consequently, the voltage measured is across the resistance of both the selected Branch Circuit Breaker 134 and the Main Breaker 108 in series. In a Sub-Panel there is no Main Breaker and so the voltage measured is across the selected Branch Circuit Breaker 134 alone.

Referring now to FIG. 11, a simplified block diagram of an Input Module is shown. Connector 146 (corresponding to connector 207 in FIG. 5) is essentially a feed through to Connector 147 (corresponding to connector 208 in FIG. 5). The bus connecting connectors 146 and 147 includes Line 1 (L1), Line 2 (L2), Ground (G), DC power for the microprocessor 148 (P) and a multi-drop bi-directional communication line (C). This bus structure allows Input Modules to be daisy-chained as needed to accommodate the number of breakers in the Load Center. A power supply 158 fed by diode 159 from ground 160 develops a DC voltage relative to L2 to power the detection circuits on that phase, comprising a protection circuit 154, an amplifier/detector 155 and a linear opto-transmitter 156. The output of 156, responsive to the voltage across the selected breaker, is coupled to the ground referenced microprocessor 148 by opto-receiver 157 to provide galvanic isolation. One or more LED's 161 or other indicators may be included to indicate module power and/or status conditions.

The small AC voltage developed across each Branch Circuit Breaker is sensed by one of the two detection circuits: one whose circuit common is L1 and the other whose circuit common is L2. But each breaker pole might be fed by either L1 or L2 depending on its position in the Load Center. The circuitry in the Input Module therefore provides a switching means to connect each probe to either the L1 or L2 detection circuits. Referring again to FIG. 11, we see a magnetic probe 149, one of a series of probes magnetically connected to the terminals of the branch circuit breakers, as above, which feeds through a current-limiting resistor 150 and switch 151 to sensing circuits 154, 155, 156, as above, which are referenced to L2. The same probe 149 feeds through current-limiting resistor 152 and switch 153 to similar circuits referenced to L1. That is, each of the probes, which are individually connected to one of the circuit breakers, is provided with two switches, corresponding to switches 151 and 153, with associated current limiting resistors 150, 152. On startup both switches 151 and 153 are open; the microprocessor must determine which phase the probe is connected to and therefore determine which switch to activate to measure the voltage. If probe 149, for example, is connected to a L1 breaker and switch 151 is closed, a full 240 volts will be seen and current flow will be limited only by the value of current-limiting resistor 150. If switch 151 is open and switch 153 is closed, the proper arrangement if probe 149 is connected to L1, then only a very small current will flow due to the voltage across the breaker's internal resistance. One novel aspect of the current circuit is to incorporate an over-current detection means in protection circuit 154 that can instantly (e.g. within microseconds) switch off all the switches when the current exceeds a preset low value, thereby limiting the power dissipation in current-limiting resistor 150 to an acceptable value. The first step during startup, therefore, is to determine, by alternately closing switches 151 and 153 corresponding to the series of probes, the phase to which each branch circuit breaker is connected.

In summary then, each Input Module resides on a bus that contains L1, L2, a communications line and ground-referenced DC power for the microprocessor. Voltage-measuring circuits ride on each of the two phases to measure the AC voltage relative to that phase, and then transmit the data via a linear isolator to the ground-referenced microprocessor, which communicates directly on the bus to other components. The microprocessor is capable of detecting which phase each input is referenced to and of switching the input to the appropriate phase. During operation, the microprocessor generally measures the voltage drop across each breaker sequentially and reports the readings on the communications line.

The preferred embodiment of the current-measuring circuits is shown in the simplified schematic diagram of FIG. 12. Back-to-back LEDs 163 and 164 are the input diodes of two fast opto-isolators that when activated immediately shut off all the switches. They also serve to clamp the input line to within a couple of volts of L2 to protect the amplifier circuits. In the event that any probe is connected to the wrong phase, a relatively large current (on the order of 50 mA) will flow through one of the LEDs and thereby quickly open the switches. The microprocessor 148 senses this condition and tries the other switch. Since the voltage developed across the breaker due to current flowing through it is less than the ON voltage of the LED, the switches will be allowed to remain on only when switched to the right phase. If the probe is connected to the wrong phase, to ground or if the circuit breaker is switched OFF, the protection circuit will instantly turn off all the switches.

The preferred method of measuring the small voltage developed across the breaker is by way of a switched integrator 166 configured to integrate the voltage over each positive half-cycle of the line voltage, thereby providing an average of the current over the half-cycle and good high-frequency noise rejection. Since the PCA applies a rectified load, i.e., current flows through the load only during positive half-cycles, the integrator need only measure the voltage during the same positive half-cycles.

Integration is accomplished by employing a switch 168 to alternately charge and reset integration capacitor 172 on successive half-cycles of the line. The switch 168 is very simply driven by the line voltage itself through resistor 169 and clamped to the positive DC rail by diode 170.

FIG. 14 shows a simplified schematic of the Main Module 35 of the LCI 15. This module contains a microprocessor 177, which serves as the master controller for the LCI. The microprocessors in each Input Module are there only to control local switching and to minimize the number of interconnects needed. Two bus connectors 179 and 180 are provided, one for each of the Input Modules on each side of the Load Center. A power supply 181 provides ground-referenced DC power for microprocessor 177 and all the Input Modules via the bus line 182 labeled P (Power) and the bus ground 183 labeled G (Ground). This power supply 181 is preferably powered by both phases so that the LCI can operate with either or both phases connected. A bi-directional multi-drop communications line 184 labeled C (Communications) allows the microprocessor 177 to communicate with any Input Module. This communications line may consist of one or more physical wires depending on what signaling method is selected. An optional radio link 185 may be included to allow direct radio communications with the PDA. It is optional because the umbilical cable 17 serves as a direct communications link between the LCI and the PCA which itself has a radio link to the PDA. The preferred embodiment of the LCI, as illustrated in FIG. 5, also includes LEDs to indicate communications activity 209, power on L1 (210) and power on L2 (211).

As noted above, a coaxial umbilical cable 17 connects the PCA to the LCI and serves a number of useful functions. The shield of the umbilical connects the PCA circuit ground to the LCI circuit ground 91 to provide a source ground reference for PCA measurements. The center conductor of the umbilical 89 serves a number of purposes simultaneously. First, the Umbilical Interface block 197 continuously couples DC power (V+) from power supply 181 to the center conductor to power the PCA. The Umbilical Interface (UI) block 197 is controlled by the microprocessor 177 via control lines 199 to switch the center conductor 89 as needed to support other functions. Normally, the center conductor 89 is connected as a bi-directional communications line between the PCA and the LCI. When needed, it is switched to couple the distance-measuring pulse to the L1 and L2 via line 198.

The LCI and the PCA work together in the SafeWire™ system to perform a complete inspection of household wiring. The remaining functional blocks of FIG. 14 can only be discussed relative to this inspection so those tests that apply will be summarized below.

The first basic wiring test measures the resistance of each wire in an outlet under load. The measured resistance at the PCA is the total source resistance seen at the outlet, including both the resistance of the wire from the outlet to the Load Center and the resistance leading up to and including the Load Center. One objective of SafeWire™ testing is to determine the gauge of the wire (if the length of the wire and the resistance of the wire are known, the gauge can be easily estimated), so there exists a need to separate the resistance of the wire from the outlet to the Load Center from the resistance leading up to the Load Center. This is accomplished by the inclusion of two Multi-Function Interface blocks, 118 and 119, fed by current-limiting resistors 117 and 116 respectively, that can measure the voltage produced at the input to the Load Center when the PCA test load is applied. From these measurements, the source resistance feeding the Load Center can be calculated and subtracted from the total resistance measured to obtain the Branch Circuit wire resistance. The wire resistance from the outlet to the Load Center can then be obtained by subtracting the Main and Branch Circuit Breaker resistances, measured in the manner described below.

The second basic wiring test is to determine to which Branch Circuit the outlet is connected. During PCA testing the load is applied for approximately one second or 60 line cycles. As described above the LCI measures the voltage drop across each Branch Circuit Breaker by integrating one half-cycle and resetting the other half-cycle. Thus it takes one line cycle to measure the voltage drop across each breaker and thus the voltage drop across sixty breakers can be measured during a one-second PCA load test. Simply put, the Branch Circuit Breaker that shows a corresponding increase when the PCA load is applied is the Branch Circuit to which the outlet under test is connected.

The third basic wiring test performed by the SafeWire™ system is to measure the length of the wire from the outlet to the Load Center using the novel method described below, in Section 6. Briefly, when given the command, the microprocessor 177 switches the Umbilical Interface 197 to route the pulse on the umbilical to line 198 which is conditioned by buffer 200 and then applied to L1 and L2 through the High Frequency Coupling block 201 via AC coupling capacitors 202 and 203. The rest of the length measurement is performed by the PCA, as detailed below.

The fourth and final basic wiring test performed by the SafeWire™ system is to monitor the line for high-frequency noise at the Load Center during various tests. Electrical arcing, even at very low currents, produces wideband high-frequency noise that is conducted down the wiring to the Load Center. The present inventor has a number of patents that describe swept radio-frequency detection means responsive to arcing, including U.S. Pat. Nos. 5,729,145, 5,223,795, 5,434,509, and 5,223,795. The same High-Frequency Coupler (HFC) 201 used for wire length measurements is used to couple high-frequency signals from L1 and L2 to a radio-frequency arc noise detector. A high-frequency buffer 204 feeds a Radio Frequency Detection (RFD) block 205 controlled by the microprocessor 177 via control lines 206. The RFD block 205 may be, for example, a narrowband radio receiver swept by control lines 206. The output of the RFD block 205 is preferably responsive to the logarithm of the wideband noise. When arcing is detected, the microprocessor 177 measures the number of events and the maximum duration event duration, and sends this data to the PDA via the Bluetooth radio link 185 which, in turn, displays a window indicating to the electrician that arcing has occurred.

The arc sensing feature of the LCI can be used to advantage to quantify arcing that normally does occur, such as when a switch is opened or closed, and to detect arcing that normally should not occur, such as a lamp fixture arcing when the fixture is physically tapped, or arcing that may occur when the PCA applies a load to the branch circuit. The novel method of the present invention is for the electrician to provide a stimulus with one hand, in the form of flipping switches, tapping fixtures or running a PCA test, while viewing the PDA in the other hand which is programmed to display any arcing that may occur. This ability to view the display while simultaneously providing a stimulus is the principal reason why the PDA of the preferred embodiment is adapted to be wireless.

To test a switch, the electrician carries the PDA in one hand and toggles the switch with the other. The PDA will display and record the number of arcs and the total arc duration, for both the switch ON and the switch OFF arcs. Several arcs on the order of a few milliseconds in duration are typical. Too many arcs or too long a duration or arcing that persists after the switch is flipped are indicative of a worn-out switch and a potential fire hazard. Please refer to the present inventors cited patents above for more discussion of the nature and detection of arcing. Similarly, any arcing that occurs during PCA testing will automatically cause a window to pop-up on the PDA that displays the number and duration of the arcs detected. To test light fixtures and the like, particularly fixtures that normally get hot and are therefore more likely to developing arcing faults, the electrician taps the fixture with a wooden stick or the like while watching for arcing on the PDA. Finally, appliances can be readily check for both switch arcing and arcing due to physical stimulus in a similar manner.

4. Safe Wire™ Magnetic Probe

The SafeWire™ Load Center Interface requires temporary sensing connections to be made to each branch circuit in a Load Center. Direct contact alligator clips could be used, but the close proximity of line voltage high-current contacts makes using such clips quite unsafe because of the real probability of one slipping off or shorting to the chassis or another contact. There exists a need, therefore, for a better mechanical arrangement for such temporary connections.

The Magnetic Probe means of the present invention is a safe and convenient means to make temporary electrical connections to ferrous contacts for testing purposes. The present inventor realized that since circuit breakers commonly use steel bolts to secure the wire to a circuit breaker, because non-ferrous materials like brass are too soft to support the torque required to secure the connections, a magnetic sensing probe could be used to advantage. The idea is to simply stick a magnetic probe on to the commonly flat surface of the bolt to make contact to the circuit.

FIG. 15 shows a mechanical drawing of a magnetic probe according to the preferred embodiment of the present invention. The magnet 212 extends out the end of an insulating handle 213, which is attached to the end of a sensing wire 214. FIG. 16 shows one such probe 216 attached to a typical Branch Circuit Breaker 215 and a second probe 217 positioned near to but not attached to the circuit breaker wire clamping bolt 218. The size of the magnet and probe are sized to accommodate the bolt 218. FIG. 17 shows another probe 220 attached and nearby but unattached to a typical Main Circuit Breaker (Service Breaker) 219. The large gauge service wires are normally secured to the circuit breaker with large steel socket-head setscrews 221, and the size of the probe 220 is adapted to suit these larger setscrews. FIG. 18 shows yet another probe 223, this one adapted to attach to the screw 224 of a typical grounding or neutral bus bar 225.

One probe is needed for each circuit breaker pole in the SafeWire™ system. These poles can number up to 48 or more, so it is therefore advantageous to have each probe cost as little as possible to manufacture. FIG. 19 shows the preferred construction of a low cost probe. The magnet 226 is made to press fit into the end of the probe body 228 which is made of an insulating plastic or retained by some other convenient means. The magnet 226 is preferably coated with a highly conductive, non-corroding metal like nickel or gold. A ferrous, i.e., steel, spacer 227 is adapted to retain the outer insulation of the test wire 230, by means of inside screw threads or the like or by crimping the spacer 227 onto the wire 230.

The wire 230 is fed first though retainer 229 and then through spacer 227, stripped back to expose the multi-strand conductor 231, and then flared out as shown. The outer diameter of spacer 227 is small enough that it slides freely inside the probe body 228. As the assembly is inserted into the probe body 228, the steel spacer is strongly attracted to the magnet 226, thereby compressing the flared wire strands 231 between the magnet 226 and the spacer 227, and making a secure and direct contact between the conductor strands and the conductive metal coating on magnet 226. The complete assembly is shown in FIG. 20.

In the SafeWire™ system the test probes are attached to line voltage, high current capacity contacts. Consequently, it is important to incorporate some means of fusible protection in the event that the other end of the probe wire is inadvertently shorted to ground or the opposite phase. The simplest way to do this is to place a very fine conductor, perhaps on the order of 34 gauge or less, in series between the cable 230 and the magnet 226, so that the wire itself will fuse open in the event of a short circuit. The preferred embodiment of the Magnetic Probe uses a fusible protection means 232 in incorporated in the probe body. This protection means 232 may consist of a fuse or, in some applications, a high-value resistor which itself limits the current to low values.

5. AC Balance Method

This section relates to a circuit and method for measuring the resistance of household power distribution wiring under load. In its simplest embodiment, the circuit is implemented as a stand-alone plug-in module that when plugged into a standard 3-prong grounded household outlet can determine the individual resistances of each wire feeding the outlet. This stand-alone unit, however, when plugged into an older 2-prong ungrounded outlet or a 2 conductor lamp socket, can determine only the combined resistance of the two wires feeding the outlet (socket). In the preferred embodiment, therefore, developed for use in the SafeWire™ system, a separate ground reference wire that runs from the Load Center to the outlet (socket) under test, that is, the umbilical cable, is used to enable the method to determine the individual wire resistances in both 2-wire grounded and 3-wire ungrounded outlets.

The basis of this aspect of the present invention, named by the inventor the AC Balance Method, is to measure the average DC value of the AC voltage waveform at the outlet (normally very close to zero volts), then apply a significant rectified load to the outlet and measure the change in average value. By applying the load between different sets of wires and measuring the difference in DC average values, one can determine the resistance of each wire feeding the load.

Referring first to FIG. 22, a simplified schematic representation of an AC power source, distribution wiring and the stand-alone measurement means of the present invention is shown. An AC power source 233 feeds three wires to distribute power to outlets downstream; a "Hot" wire 234 labeled H, a Neutral wire 235 labeled N, and a Ground wire 236 labeled G. Each of these three wires exhibits an inherent length-dependent resistance labeled $R_H$, $R_N$ and $R_G$ respectively. An outlet some distance downstream has plugged into it a tester according to the present invention that comprises a rectifying diode 237, a load resistance 238 and two switches 239 and 240. By closing switch 239, for example, the load resistor 238 is placed between wires H and N, which causes current to flow through these wires during the positive half-cycles of the power waveform. Closing switch 240 causes current to flow through the H and G wires. An average responding voltmeter $Vm_N$ measures the average DC voltage between N and G at the outlet and another voltmeter $Vm_G$ measures the average DC voltage between H and G at the outlet.

First, assume $S_N$ is closed and $S_G$ open. In this case, current flows through $R_H$ and $R_N$ but no current flows through $R_G$. With $R_L$ and the line voltage $V_L$ known, the current is approximately $V_L/R_L$ and VmN is simply this current times the Neutral resistance. Since current only flows on positive half-cycles, the waveform at $Vm_N$ is a half-wave sine wave the average value of which can be simply calculated by integrating over one complete cycle.

$$V_{avg} = \frac{1}{\pi}\int_0^\pi V\sin x\,dx + \frac{1}{\pi}\int_\pi^{2\pi} 0\cdot\sin x\,dx = \frac{2V}{\pi}$$

Thus since, in this case, $V=I_L R_N$, $$Vm_N(avg) = \frac{2}{\pi}I_L R_N$$

and we see that the average measured voltage is proportional to $R_N$.

The $Vm_H$ measurement yields the Hot side resistance as follows. $Vm_H=V_L-I_L R_H$ during positive half-cycles and $Vm_H=V_L$ during negative half-cycles. Thus again integrating over one complete line cycle to get the average, $$V_{avg} = \frac{1}{\pi}\int_0^\pi (V_L - I_L R_H)\,dx + \frac{1}{\pi}\int_\pi^{2\pi} V_L\,dx =$$

$$\frac{1}{\pi}\int_0^\pi V_L\,dx + \frac{1}{\pi}\int_\pi^{2\pi} V_L\,dx - \frac{1}{\pi}\int_0^\pi I_L R_H\,dx$$

but since $$\frac{1}{\pi}\int_0^\pi V_L\,dx + \frac{1}{\pi}\int_\pi^{2\pi} V_L\,dx = 0$$

we are left with simply $$V_{avg} = -\frac{1}{\pi}\int_0^\pi I_L R_H\,dx$$

Evaluating this integral we get $$Vm_H(avg) = \frac{-2}{\pi}I_L R_H$$

Thus the measured voltage is negative and proportional to $R_H$. A novel aspect of this invention is based on the realization that by taking the average value of the high-side voltage while applying a rectified load, we are able to reject the high common-mode line voltage (between the positive and negative half-cycles) and measure the small voltage drop produced by $R_H$ directly. Referring to FIG. 23, one can see graphically that the average DC value of the sinusoidal line voltage is normally zero. As illustrated in the graph of FIG. 24, when a rectified load is applied, the positive peak alone is diminished thereby driving the average value negative, as indicated by the last equation above.

Finally, when $S_G$ is closed and $S_N$ open, current flows instead through the ground conductor. A similar mathematical analysis yields the following results $$Vm_N(avg) = \frac{-2}{\pi}I_L R_G$$

$$Vm_H(avg) = \frac{-2}{\pi}I_L(R_H + R_G)$$

Thus, while we can get $R_G$ directly, the high-side measurement yields only the sum of $R_H$ and $R_G$. Since, however, we have already measured $R_G$ we can simply subtract it from the total to get $R_H$.

In all the analysis above we make the approximation that $$I_L = \frac{V_L}{R_L}.$$

More precisely $$I_L = \frac{V_L}{R_H + R_L + R_N} \text{ or } I_L = \frac{V_L}{R_H + R_L + R_G}$$

depending on which switch is closed. Since the wire resistances $R_H$, $R_N$ and $R_G$ are typically much smaller than the test load resistor $R_L$, this approximation will produce a maximum error on the order of a few percent. This will normally be adequate to alert the electrician to a fault. If more precision is required the exact equations can be readily worked out.

Thus, the stand-alone tester of FIG. 22 plugs into a 3-wire grounded outlet and can measure each wire's resistance individually by flowing current through one return path while using the other return path (with no current flowing through it and thus no voltage drop across it) to reference the measurement to the voltage source. With older 2-wire ungrounded outlets current always flows through both conductors and thus a source reference is not available. As can be seen in the equivalent circuit of FIG. 25, $$Vm_H(avg) = \frac{-2}{\pi} I_L (R_H + R_N)$$

and only the sum $R_H + R_N$ can be determined. If a fault exists in the $R_N$ path, for example, it is desirable to be able to determine the resistances $R_H$ and $R_N$ independently so that the fault can be quickly located.

To enable individual wire resistance measurements on 2-wire systems a separate voltage source reference connection can be used as shown in FIG. 26. In this case, the preferred method for the SafeWire™ PCA, a separate ground reference wire 244 is provided (by the umbilical cable in the SafeWire™ system) to enable all three wires 234, 235, and 236 to be measured relative to the source voltage ground 244, using techniques similar to those described above. Since only a very small amount of current (microamperes) need flow through resistance $R_m$ 245 of the ground reference wire 244, the voltage drop across it can be made negligible. The addition of a third voltmeter, $Vm_G$ 243, allows a direct measure of the voltage drop across $R_G$ instead of having to derive it as described above relative to FIG. 22. These voltmeters measure average dc voltage and can be implemented as simple low-pass filters as described previously in the PCA section.

The AC Balance Method can also detect grounding anomalies such as an open ground or the ground terminal of an outlet incorrectly wired to the Neutral conductor, or the ground and neutral wires connected together. Referring to FIG. 26, if the ground connection to an outlet is open, $Vm_G$ 243 will increase to the average value of the half-wave line voltage when $S_G$ 240 is closed, a level very much greater than if the ground connection were made. If the Ground terminal of the outlet is connected to the Neutral wire of a 2-wire system (no separate ground), then $Vm_G$ 243 and $Vm_N$ 241 will read precisely the same voltage when either $S_N$ 239 or $S_G$ 240 are closed. If the Ground and Neutral wires on a 3-wire system are connected together at the outlet, then $Vm_G$ 243 will show a voltage rise when $S_N$ 239 is closed (it should not) and $Vm_N$ 241 will show a voltage rise when $S_G$ 240 is closed (it should not).

The AC Balance Method disclosed herein can thus be used to advantage to identify and locate incorrect or deteriorating wiring connections. If the resistance of each wire is known, the wire containing a high-resistance fault can readily be identified. A three-wire load tester can determine the resistances of each wire individually calculated in the manner described above. A two-wire load tester can only determine the sum of the two feedwire resistances unless an external ground reference wire is run to the voltage source.

6. Least-Time Propagation Method (LTP)

This section relates to a circuit and method to determine the length of wiring in household wiring. The methods disclosed herein are intended for use in the SafeWire™ Home Wiring Inspection System but can be used alone as a stand-alone tester. The basic method of the present invention is referred to by the inventor as the Least-Time Propagation or LTP Method.

As described in the preceding section, the SafeWire™ Home Wiring Inspection System employs the present inventor's AC Balance method to measure the resistance of feed wires from any outlet to the Load Center. If the length of each wire to the Load Center could also be determined then the gauge of the wire, for example, could be calculated, and a determination made whether the wires were in danger of being overloaded (for example, if a 30-amp breaker were connected to wires only rated for 15 amps). The length of the wires to each outlet on a branch circuit, if known, could also be used to produce an accurate schematic diagram of the circuit. There exists a need, therefore, to provide a method and means to determine the length of wires in a house.

Most household wiring uses "Romex"-type cable, which consists of two insulated wires, laid parallel to each other in a jacket, with or without an uninsulated ground wire in between. The constant physical spacing of the wires from one another gives Romex cable a fairly constant impedance on the order of 75 ohms and makes it capable of conducting high frequency signals in a transverse transmission line mode. It is a relatively simple matter to measure the length of an isolated section of Romex cable using conventional step time-domain reflectometry (TDR) techniques with good results. Although there is some high-frequency dispersion in Romex-type cables, which causes the leading edge of pulses used for timing to roll-off, lengths of cable up to several hundred feet can be readily measured.

However, the present inventor has done extensive experimentation with conventional Time Domain Reflectometry on actual household wiring and finds that the combination of the less-than-ideal high-frequency characteristics of Romex cable, combined with the presence of branch circuits that split off in the middle of a run to feed other circuits, switch circuits, which cause reflection of pulses, and other factors, render the use of conventional TDR impractical for household wiring. The number of reflections and the low quality of the reflections quickly render the reflections nearly indecipherable. There exists a need, therefore, for an improved and simpler technique to measure the lengths of household wiring.

The present invention provides a circuit and method whereby the length of wiring in a household can be readily measured, for example between two outlets or between an outlet and the Load Center, despite the complexities imposed by household wiring. The method requires an external coaxial cable to be run between the two points being measured. In the SafeWire™ system, this single coaxial "umbilical" cable, which as discussed above serves a number of other useful purposes, is spooled out on a retractable reel and generally runs between the Load Center and the outlet (or lamp socket) under test. Connected in this manner, the inventive LTP method can be used to measure the distance from the outlet (or lamp socket) under test to the Load Center. More generally, however, the LTP method can be used to measure the distance between any two points, e.g. any two outlets.

The Least-Time Propagation method is best understood with reference to FIG. 27 which shows the LTP circuit on a 2-wire branch circuit, such as might be found in older houses. The Load Center, represented as a simple voltage source 246, feeds a branch circuit (circuit breaker not shown) with Hot conductor 247 and Neutral conductor 248. Outlets 249, 250 and 251 are located at various distances from the Load Center. The LTP instrument, comprising a microprocessor 252 and associated circuitry, is plugged into outlet 251 (it could equivalently be connected to a lamp socket) and a fixed-length coaxial cable 253 runs from the instrument to the outlet 249.

To measure the distance between outlet 251 and outlet 249, the microprocessor 252 first drives line driver 263 to produce a pulse at point A, the pulse being shown in FIG. 28 (A). The leading edge of the pulse at A propagates down coaxial cable 253 through coupling transformer 255 and capacitor 256 to produce a pulse at point B. Since the length of coaxial cable 253 is fixed, $t_{ref}$ (the propagation time along the fixed length of the umbilical cable) in FIG. 28 is constant. Now the pulse at point B propagates down the Romex cable until it reaches point C where it couples through coupling capacitor 258 and coupling transformer 257 to Programmable Threshold Detector 259. This fast detector has a programmable threshold set by control line 260 and serves to sense the arrival of the leading edge of the pulse. A fast constant input integrator 261 serves to convert the time interval $t_{cable}$ (the propagation time along the circuit to be measured) into a DC voltage that can be fed into an analog input on microprocessor 252. Since $t_{ref}$ is known and constant, the microprocessor 252 can be programmed to wait that amount of time after issuing the pulse at A before starting the integrator. When the pulse is sensed at the PTD 259, the integrator stops integrating and the value is held until the microprocessor 252 can read the integrated voltage, which is directly proportional to the distance from B to C. Any difference between the start of integration and the time the pulse reaches point B can simply be subtracted out of the result to arrive at the actual distance.

Coupling transformer 255 serves to transform the impedance of coaxial cable 253 to the impedance of the line at outlet 249 and coupling capacitor 256 serves to AC couple the transformer to the line. The impedance of the line varies according to wire type, which two wires are sensed (e.g., H and G or H and N) and whether the signal is sensed at the Load Center or not. Most Romex wires are on the order of 75 ohms between adjacent wires and 120 ohms between H and N on Romex with a ground. At the Load Center, being the confluence of many Romex wires, the impedance is much lower, typically on the order of 10 ohms. Thus the winding ratio of the coupling transformer is best optimized to match impedances in these different situations.

The reason the method has been coined the Least-Time Propagation method is that the first pulse that arrives at point C, regardless of what other reflections may eventually arrive, is the pulse originating at point B. For example, another outlet 250 disposed between outlets 249 and 251 will conduct the signal out the branch and reflect at the first discontinuity it encounters and travel back to point C. However, it will necessarily arrive after the leading edge from point B arrives because that takes the shortest possible path. If coupling transformer 255 is actually at the Load Center, the pulse at point B will propagate down all the branch circuits and tens or hundreds of reflections will find their way back to point C—but all of them will necessarily arrive after the leading edge we are interested in. This is one principal idea behind the present invention—that the principle of least time will insure that regardless of the number or complexity of reflections that will arrive at the sensing point C, the first to arrive is the one of interest and therefore detectable.

The second basic idea of this invention is the concept of effectively performing time domain filtering by sampling only in a very short synchronized time window, so as enable reliable sampling even in the presence of random impulse noise. While impulses invariably occur occasionally on household wiring, from lamp dimmers and the like, or even remote lightning impulses, the LTP method only looks for an edge during a very short interval of time after it issues the leading edge pulse, so as to greatly reduce the chance of one of these random pulses interfering with the measurement. The measurement process can also be repeated a number of times to further reduce the chance of interference and confirm the results.

More specifically, again referring to FIG. 28, the PTD 259 is enabled only during a period of time $t_{cable}$ extending from when the leading edge reaches point B for a period just long enough for the maximum expected cable length to be measured. With the propagation speed in Romex cable on the order of 1.7 ft/ns, and a maximum cable length of say 1000 ft, this amounts to a detection window $t_{cable}$ of only 600 ns. Because of this narrow time-domain detection window, an enormous amount of filtering is afforded which results in high detection reliability. When the LTP method is used in the PCA of the SafeWire™ system, all loads in the house are deliberately turned off, and the system is "quiet" electrically. Pulses do occur but the probability of them occurring in this extremely narrow time slot are diminishingly small. For this reason, detection reliability is high. Furthermore, as noted, since the entire measurement process is quick, the process can easily be repeated a number of time and the result arrived at only on successive repeatable results.

Due to less than ideal high-frequency characteristics of Romex cables, the pulse may experience significant attenuation on long lines, as noted above. The leading edge will also roll off somewhat due to high-frequency dispersion effects. To achieve the highest distance accuracy, the threshold of the Programmable Threshold Detector 259 should be set to the lowest practical level by microprocessor 252. This can be achieved by adaptively setting the threshold to a level just above the noise floor, i.e., to a point where random threshold excursions are just infrequent enough to enable reliable detection of the desired edge.

The measurement made on a 3-wire grounded outlet is very much the same as with the 2-wire system of FIG. 27. Referring now to FIG. 29, we see that the only substantial difference is that the coupling transformers are now connected between Hot 247 and Ground 266 instead of Hot 247 and Neutral 248. The transmission line impedance between adjacent wires (~75 ohms) is lower than that between conductors separated by a third conductor (~120 ohms). If the connections (outlet 249) are made at the Load Center there is no difference whether coupling transformer 255 is connected to Hot and Neutral or Hot and Ground because Neutral and Ground are connected together there. Optimal signal response at outlet 251, however, is between Hot and Ground as connected in FIG. 29.

As discussed previously, the end of coaxial cable 253 can be plugged into an outlet or connected to the Load Center. With the SafeWire™ system, it is normally connected to the Load Center through circuits contained in the Load Center Interface or LCI, thereby measuring the wire length from the outlet (or lamp socket) under test to the Load Center. This coupling transformer 255, in this case, is optimized to match the coaxial cable impedance (typically 50 ohms) to the Load Center Impedance (typically 10 ohms).

On occasion, it may be desirable to measure the length of wire between two outlets. To do so with the SafeWire™ system, the umbilical cable 253 can be replaced with another cable that plugs into an outlet, so that the length of wire between two outlets can be determined. In this case, it may be desirable to be able to detect whether the end of cable 253 is plugged into a socket or not. This can be detected by the modified circuit of FIG. 30. The modification consists of adding a comparator 269, which is connected by line 268 to the umbilical cable. A resistor 267 plus the output impedance of buffer 263 combine to match the characteristic impedance of the umbilical 253. If the coupling transformer 255 at the end of coaxial cable 253 is floating (that is, is not connected to the wiring), the pulse will be reflected with no inversion back to point A, the threshold of comparator 269 being set to be responsive to its increased voltage. When the coupling transformer 255 is connected to the line, the reflection there will be minimized and the higher threshold of comparator 269 will not be reached.

Measuring the reflected wave on umbilical 253 can also be used to automatically measure the length of the umbilical cable. This may be useful if extension cables are supplied to lengthen the umbilical. In this case, a switch (not shown) operated by microprocessor 252 would be included to optionally switch line 268 to feed into programmable threshold detector 259, the threshold of which is set to trigger on the reflected wave from an unterminated umbilical 253. In this manner, the length of the umbilical can be measured before it is plugged into the LCI using conventional TDR methods. If it is desired to be able to measure the length of umbilical 253 while it is plugged into the LCI, a switched connection could be added to the LCI to either open or short the umbilical 253 so as to provide a reflected waveform. In any case, these operations should require little or no input from the electrician, serving only to automatically compensate for the presence of one or more extension umbilical cables.

7. Electromagnetic Wire Locating Method (EWL)

This section relates to a circuit and method to detect and locate hidden household wiring. The methods disclosed herein are intended for use in the SafeWire™ Home Wiring Inspection System but can also be used in a stand-alone device. The basic method of the present invention is referred to by the inventor as the Electromagnetic Wire-Locating (EWL) method.

During the course of standard SafeWire™ testing, as described in Section 2 with reference to FIG. 26 (a portion of which is replicated in FIG. 31, using the same reference numbers as FIG. 26) the PCA applies a rectified test load to each outlet. Referring now to FIG. 31, the boxed-in portion labeled PCA 273 includes an additional switch 272, the purpose of which is to direct the load test current from the Hot conductor 234 either back to the outlet 251 through line 271 or through a separate line 270 (i.e., the umbilical cable) back to the voltage source 233 (typically the Load Center). During standard PCA testing the new switch 272 is in the position shown and the load current $I_H$ flows down the Hot conductor 234, through the rectifier 237 and load resistor 238 and then back through either the Neutral conductor 235 or the Ground conductor 236 depending on whether switch 239 or switch 240 is closed. In either case, a current $I_L$, equal and opposite to $I_H$, flows back down the conductors, causing the magnetic field around the conductors to be nearly completely cancelled. One potential way to detect and locate a hidden wire is to sense the magnetic field near the wire generated by the current flowing through it. Unfortunately, when the return current path is closely coupled to the source current path, as is the case in Romex wire and the like, the magnetic field is substantially cancelled. By changing switch 272 so that the current flows instead through a separate return path 270, which is physically distanced from the source path 234, the magnetic field is no longer cancelled and therefore detection and location of the wire by sensing the magnetic field becomes practical.

The first novel idea of the Electromagnet Wire Locating method of the present invention is thus to route the test load current back to the Load Center through a physically removed path so as to not cancel the magnetic field generated. A convenient path with the SafeWire™ system is the shield of the SafeWire™ Umbilical cable because it is already routed back to Ground at the Load Center. It is not necessary, however, to route the current all the way back to the Load Center. All that is needed is to route it away from the hot source conductor in the area being searched to locate the wire. Therefore, another approach would be to route the current externally just as far as another outlet, for example, as shown in FIG. 32. In this case, the return wire 270 is routed to the Neutral conductor 235 at an outlet 249 between the outlet under test 251 and the voltage source 233.

To locate a non-energized hidden wire, such as the Ground wire 236 or the Neutral wire 235, that is, separately from the Hot wire as discussed above, current must be externally supplied to the wire, so that it will emit a magnetic field that can be detected. Referring now to FIG. 33, another switch 274 is added to the LCI, and serves to switch in a power supply 275 that provides the current needed to generate a magnetic field. To locate the Ground wire 236, switch 239 is closed and current $I_L$ flows through the Ground wire 235, the current being the voltage of the power supply 275 divided by the resistor $R_{PS}$ 276. The power supply 275 is preferably derived from the line voltage 234 to provide half-wave rectified pulsed power to generate a similar pulsed magnetic field.

The preferred embodiment of the EWL tool in the SafeWire™ system makes use of a two-axis magnetic field sensor to determine not only the proximity of the hidden wire but also the axis the wire lies on. To make use of this information a two-dimensional display is needed; in the preferred embodiment of the SafeWire™ system, the display of the PDA is employed. The sensor and circuits of the EWL tool, shown in the simplified block diagram of FIG. 34, are built into a thin "sled" package that attaches to the back of the PDA and mates with the PDA's interface connector. Power and communications with the PDA are supplied through this interface. In this manner, the PDA, with the thin sled attached, can be slid across the surface of a wall having hidden wires behind it, and will displaying graphics responsive to the sensed magnetic field.

Referring first to FIG. 36, we see how the tool is used. In this illustration, the wire 303 is hidden behind a sheetrock wall, for example. Current $I_L$ 304 is flowing through the wire 303 in the direction indicated. The PDA in a first position 300 displays an arrow 302 which indicates the axis of the wire and the direction of the current flow as simply derived from the two-axis magnetic field sensor. The strength of the magnetic field, and thus the proximity of the wire, is indicated by the length of the arrow 302, the arrow being the longest when it is directly over the wire, as shown in FIG. 36. As the PDA is rotated, say to a second position 301, the arrow remains stationary. As the PDA is moved off-center, to the left for example, the arrow will get shorter as the magnetic field diminishes, but continue to indicate both the axis of the wire and the direction of the current flow.

The arrow display on the PDA will only be responsive to the wire through which current is being drawn by the PCA. In practical usage, the electrician might plug the PCA into an outlet and then with the PDA initiate the wire-locating mode during which the PCA periodically applies the test load, perhaps a few cycles every second, while synchronizing the EWL tool to it. The electrician can then slide the PDA along the surface of the wall to locate the wire feeding the outlet and follow it upstream towards the Load Center.

Referring now to FIG. 34, a two-axis magnetic field sensor 277 senses the magnetic field and provides two outputs 278 and 279 each responsive to the magnetic field in the direction indicated. A bridge-type magnetoresistive sensor with a range of 0 to ±6 Gauss, such as the Honeywell HMC1022 works well. Power to the sensor bridge comes from power supply 280. Each output is amplified in amplifiers 281, detected with synchronous detectors 282, and then fed to an analog input in microprocessor 284.

Synchronous drive and detection is used to substantially reject the magnetic field resulting from background current and static background fields such as the earth's magnetic field (0.5 Gauss). Background current may be present on the line being traced, if for example, another load is present downstream. The basic principal of synchronous detection is to invert the detected signal during alternate half-cycles of the line voltage and then integrate the result. In this manner, any signal that persists over two successive half-cycles will integrate to zero and therefore be substantially rejected. Synchronous drive is inherent in the half-wave rectified load of the PCA, the load current being ON only on positive half-cycles, so this signal will pass through without being rejected. The microprocessor in the EWL tool 284 drives the synchronous detectors 282 with a signal on line 283 digitally responsive to when the load is ON. This signal can be obtained from the PCA through the Bluetooth radio link 285, preferably using the audio carrier feature of Bluetooth for real-time response. Alternatively, a direct wired link could be used. Referring now to FIG. 35, we see the voltage output on one of the axes. The output is the sum of the pulsed current response 289 due to current flowing in the wire, and the static earth's magnetic field $V_e$ 290. The difference voltage $V-V_e$ is responsive to the magnetic field on that axis.

Although the EWL tool of the preferred embodiment uses a two-axis magnetic field sensor, it may be useful to employ a three-axis magnetic field sensor which are also commonly available. For example, the wires leading to an outlet box may come from directly behind the box, i.e., perpendicular to the wall. In this case, it may be useful to the electrician to indicate this. Adapting the preferred embodiment of the present invention discussed above to add another axis is easily done by someone skilled in the art.

8. Software and System Operation

The SafeWire™ system employs several microcontrollers and an off-the-shelf PDA to perform a wide variety of tasks as discussed above. Generally, the embedded microprocessors in the PCA, LCI and the μEDT control the hardware, acquire measurements, and transmit the results to the PDA. The PDA, having much greater computing power than the embedded microcontrollers, then processes and displays the results. The PCA and LCI communicate over the Umbilical cable. The PDA communicates with both the PCA and the μEDT over a Bluetooth radio link to allow the electrician to view results while moving about freely.

The SafeWire™ System of the preferred embodiment uses custom software written for the PDA in C or C++. In the prototype, the software is written for the Palm Pilot series of PDAs (or equivalent) using the Palm API (Application Program Interface) and running on a Palm operating system, available from Palm, Inc. or PalmSource, Inc. An equivalent system could be written for other PDAs or Laptops using different operating systems such as the Windows CE or Pocket PC operating systems.

Referring to FIG. 37, comprising five "screen shots" from the PDA, labeled FIGS. 37(a)–(e) respectively, the top-level screen on a Palm Pilot PDA is shown in FIG. 37(a). The shaded lower portion of the screen is common to all Palm applications, providing system buttons (icons) and a writing area for user input. A vertical line of buttons on the right side allow the electrician to select the basic mode of operation from three groups: The "Tester" button switches to a screen that allows testing of receptacles, including outlets and light sockets, without regard to documenting the location of these devices. Normal SafeWire™ testing, wherein the location of each device is documented, is performed on the screens accessed by the "Location", "Outlets", and "Lights" buttons. As testing proceeds, the loads connected to a switch or a circuit breaker can be reviewed by pressing the "Switches" or "Breakers" buttons.

In the preferred embodiment of the SafeWire™ top-level screen (FIG. 37(a)), a simplified dynamic picture 306 of the system indicates to the electrician, at a glance, how much of the SafeWire™ system is connected, i.e., each component appears as it is plugged in. On this screen and most other SafeWire™ screens an indicator 307 flashes to indicate communications activity.

The Tester button brings up the Tester screen (FIG. 37(b)), labeled as indicated on the folder tab 309. The screen is initially blank because, as indicated on the status line 311, no adapter plug is yet selected. The electrician selects a PCA adapter plug 6 (FIG. 1) and plugs it into the PCA cable 3. The PCA 2 automatically senses the type of adapter, as discussed in section 2 above, and displays an image of the receptacle, with the name of the receptacle displayed above it, as shown in FIG. 37(c). There are many other types of receptacles, including 2-prong ungrounded, GFCI, AFCI, 2 and 3 prong 240 volt power outlets, a variety of light sockets and so forth, each presenting its own corresponding graphic and label. When the adapter plug is plugged into a powered outlet, the system will automatically sense the presence of voltage and consequently perform a predetermined series of tests on the outlet and display the results as shown in FIG. 37(d). Note that the status line 311 now says "Test Complete" and that individual results are displayed for each contact of the receptacle, the results displayed in a scrolling box, i.e., the down arrow can be selected to scroll the display for more test results. In this example, the results in the upper left box are Neutral (the name of the wire connected to this contact), 1.233V (the voltage at full load), 2.2% drop (the percentage drop or rise at full load), 133 ft (the length of this wire back to the Load Center), and 12 ga. (the calculated gauge of this wire). The full load current is the branch circuit breaker rating and the results are calculated by extrapolating from the voltage drop (rise) at the test current load, typically 10 amperes. The additional screen of FIG. 37(e) illustrates typical test results on a 3-prong 240 volt appliance outlet. Pressing the OK button takes the user back to the top level screen (FIG. 37(a)).

Figures 38A, 38B, 38C, 38D:
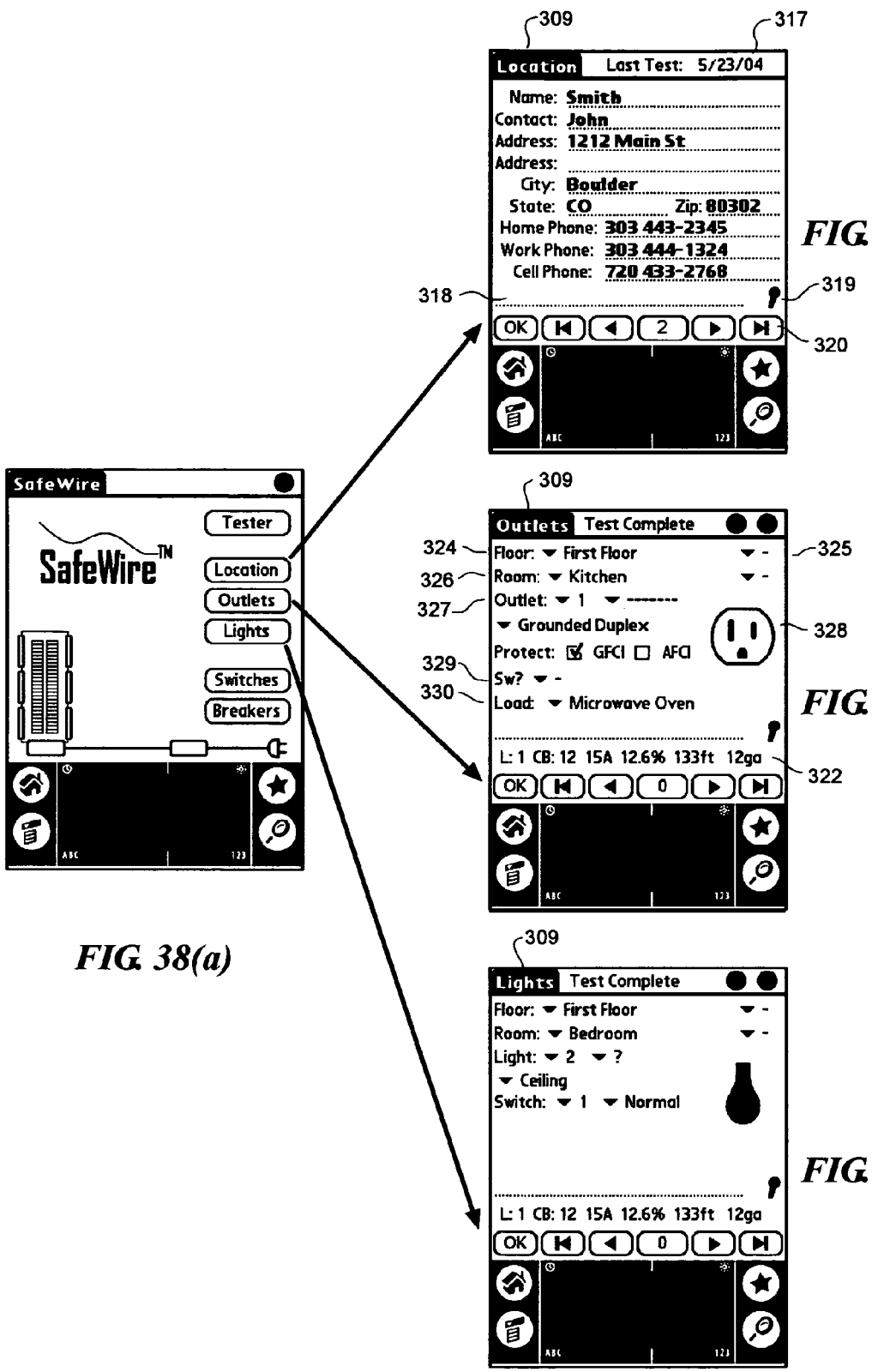

The next group of buttons, i.e., Location, Outlets and Lights, access the screens used for full SafeWire™ testing of a house. Referring to FIG. 38(a), the first button brings up the Location screen (FIG. 38(b)) as indicated on the folder tab 309. The Status line 317 now displays the last time this location was SafeWire™ tested. This screen simply accepts and displays location information, i.e., the name and address of the customer, stored in the SafeWire™ database. A line of buttons 320, common to all SafeWire™ screens with more than one record, allows access to different records. The OK button returns to the top-level screen (FIG. 38(a)). The next two and the last two buttons access the first, previous, next and last records in the database, respectively. The fourth button displays the record number, in this case 2. By tapping this button, one can directly input the desired record number to go to. Also, common to most SafeWire™ screens is a comment line 318, used to enter written comments associated with this record into the database, and a microphone icon 319, which when pressed records a spoken comment that is then likewise stored in the database. On PDAs with a built-in camera, another icon could be added to store pictures with this record.

The Outlet button brings up the Outlet screen (FIG. 38(c)) which allows the electrician to document and test outlets in quick succession. The electrician enters, by way of a pull-down list, first the floor name 324 (and number 325, if desired), then the room name (and number, if desired). Next, the outlet number is entered, as determined by any simple convention such as clockwise from the room entrance, beginning with 1. The picture of the outlet 328 and the type of outlet 327 are automatically presented depending on which adapter cable is attached. Next, checkboxes are provided to indicate whether the outlet is a GFCI or AFCI type. If the outlet is switched, then select the switch number from the pull-down list labeled "Sw?" 329, and if a semi-permanent load is attached, e.g., refrigerator, oven, etc, select that from the "Load:" pull-down list 330. When the adapter plug is plugged into a live outlet, the test proceeds automatically and a summary of the results is displayed on a single line 322 above the buttons. Tapping on the receptacle picture 328 will bring up the Tester screen (FIG. 37(d) or (e)) showing a more detailed display of the test results. The fourth button on the Outlet screen displays the outlet test record number, in this case 0, and displays a Red, Yellow or Green background to indicate, in a stoplight fashion, the status of each record. For example, if the outlet test revealed a fault, the background is red. If it revealed some parameter of concern but perhaps not quite a fault, it displays yellow. If all the test results were acceptable, it displays a green background. The Lights screen (FIG. 38(d)) works in a similar fashion to the Outlets screen except that it addressed light sockets instead of outlets.

Figure 39A:
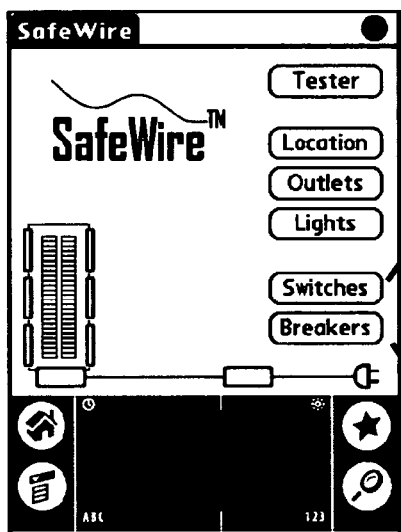
Figure 39C:
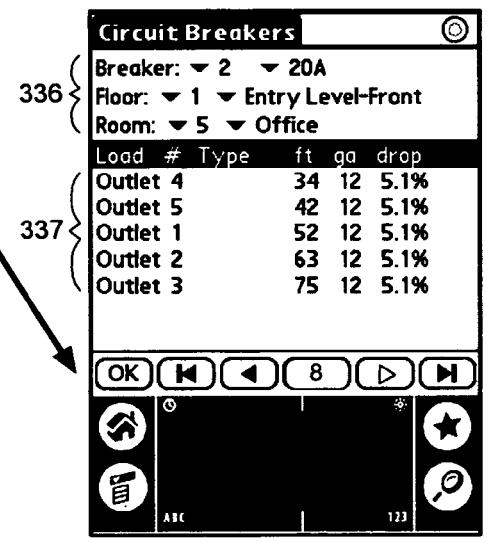

Referring now to FIG. 39(a), the Switches and Breakers screens serve to access the database from the perspective of a switch or a circuit breaker. For example, the Switches screen (FIG. 39(b)) shows a particular 3-way switch, the location and type of switch being displayed on the first three lines 332. The table below shows four lights 333 on that switch circuit and then another 3-way switch 334 on the circuit. Similarly, the Circuit Breaker screen (FIG. 39(c)) shows the location and type 336 of the selected circuit breaker and then a table displaying the outlets 337 on that circuit breaker. Note that this is where the rating of each circuit breaker is shown. Although the system can attempt to deduce the breaker rating from the measured series resistance, circuit breakers from different manufacturers vary somewhat and that approach is prone to measurement error due to the low series resistances involved. It may therefore be better to simply enter the pole rating here during initial setup of the LCI.

The prototype software was written for use with systems employing circuit breakers but can be simply adapted to also work with older systems that employ fuses for circuit protection, by, for example, adding a "Fuses" screen.

One significant advantage of SafeWire™ testing is that enough data is collected during the normal course of testing all receptacles in a home to generate both a Load Center label and a schematic diagram of the wiring. The Load Center label which lists the lights, outlets and even specific loads on each circuit breaker is easily compiled by the PDA software and can be printed out and attached to the Load Center. The label is preferably printed on a magnetic "paper" that can be conveniently stuck to the metal door of a Load Center. Magnetic "paper" that can be printed on in a standard inkjet printer is readily available from a number of sources.

The generation of a schematic diagram of the household wiring from the data compiled during SafeWire™ testing is a little more involved and as such might best be done on a separate computer, one perhaps with a printer capable of handling larger paper. Household wiring typically includes junction boxes with wires that branch in multiple directions at once, Hot wires that branch off separately to switches, and a number of other complications that, as discussed previously, make conventional TDR testing wholly impractical. The LTP method disclosed in Section 6, however, can easily measure the lengths of each wire even with such complications. Since SafeWire™ testing measures the length of every wire, all that is required to generate a schematic diagram is to sort out the data, a process easily done by a computer algorithm. Any ambiguities that arise, such as whether two outlets that are on the same branch circuit and each say twenty feet from the Load Center, are connected to a single Romex cable or two separate Romex cables, can be tagged as ambiguous by the algorithm and either displayed as such on the schematic diagram or resolved by further testing. In this example, the LTP method, as discussed in Section 6, can be further used to measure the distance between the two outlets, thereby resolving the ambiguity.

While a preferred embodiment of the invention has been disclosed in detail, with various modifications and enhancements mentioned specifically, others will occur to those of skill in the art, and are within the scope of the invention. Therefore, the invention should not be limited by the above exemplary disclosure, but only by the following claims.

What is claimed is:

1. An electrical measuring system for testing an electrical power distribution system, the electrical power distribution system comprising a load center having branch circuit breakers and a ground, the system comprising:

a first electrical measuring device electrically and physically connected to the load center, the device being capable of monitoring electrical parameters, selected from the group comprising voltage and current, at the load center, a second portable electrical device being supplied with a plurality of adapter connectors capable of being plugged into various types of receptacles on a branch circuit and capable of performing tests of said branch circuits by applying test loads across the contacts of the receptacles and measuring voltages on the contacts with respect to ground, an umbilical conductor electrically connecting the first electrical device to the second portable electrical device to provide a common reference ground therebetween, and one or more computing circuits for controlling the tests and saving the results.

2. The system of claim 1 wherein the first electrical device is capable of monitoring current through each branch circuit breaker independently and identifying the branch circuit breaker through which the monitored current is flowing.

3. The system of claim 2 wherein the first electrical device monitors current flowing through each branch circuit breaker by measuring the voltage across it in synchronization with the application of the load by the second portable electrical device.

4. The system of claims 3 wherein a magnetic probe comprising a magnet with a wire electrically connected to said magnet and a series current-limiting device, the combination encased in an insulating protective cover, is attached to a steel-wire retaining screw on each branch circuit breaker to measure the voltage across said branch circuit breaker.

5. The system of claim 2 wherein the first electrical device monitors current flowing through each branch circuit breaker by measuring the output of a current sensor, selected from a group comprising current transformers and Hall-effect sensors, in synchronization with the application of the load by the second portable electrical device.

6. The system of claim 1 wherein the second electrical device is adapted to automatically identify the type of adapter cable used.

7. The system of claim 1 wherein the second portable device is capable of applying test loads between one of the conductors of the branch circuit and ground, with a return path through the umbilical conductor, to produce a non-canceling magnetic field around the branch conductor for the purpose of tracing said branch conductor.

8. The system of claim 7 wherein a third portable electrical device is provided to indicate the proximity of, and the direction of current flow in, the branch conductor, the device comprising, a two-axis magnetic field sensor producing two signals, each responsive to the strength and direction of the magnetic field in one orthogonal direction, an electrical circuit capable of detecting the signals in synchronization with the application of the load by the second portable electrical device, and a display device capable of indicating the strength and direction of the magnetic field.

9. The system of claim 7 wherein a third portable electrical device is provided to indicate the proximity of, and the direction of current flow in, the branch conductor, the device comprising, a three-axis magnetic field sensor producing three signals, each responsive to the strength and direction of the magnetic field in one orthogonal direction, an electrical circuit capable of detecting the signals in synchronization with the application of the load by the second portable electrical device, and a display device capable of indicating the strength and direction of the magnetic field.

10. The system of claim 1 wherein the first electrical device, upon being plugged into a receptacle on a branch circuit, is adapted to sense the presence of voltage and in response initiate further measurements to be taken.

11. The system of claim 1 further including a portable computer programmed so as to allow an electrician to exercise control of the system, by selecting the tests to be performed, and to view the results of the measurements and calculations performed accordingly.

12. The system of claim 11 wherein the portable computer is wirelessly linked to the system via a radio transceiver.

13. A method enabling an electrician to test an electrical power distribution system, the electrical power distribution system having a load center and branch circuits with receptacles, the method comprising the steps of:

attaching a first electrical device to the load center, the device being capable of monitoring electrical parameters in the load center, electrically connecting an umbilical conductor between the first electrical device and a second portable electrical device, said second portable device being supplied with a plurality of adapter connectors capable of being plugged into various types of receptacles on a branch circuit, and being capable of performing various electrical tests, such that the umbilical conductor provides a common reference between the first electrical device and the second portable electrical device, moving about the branch circuits and plugging the second portable electrical device sequentially into receptacles, the device automatically performing various electrical tests at each receptacle, and evaluating the condition of the branch circuit responsive to said tests.

14. The method of claim 13, wherein the first electrical device monitors current flow through the load center in synchronization with the second portable electrical device applying a test load between contacts in the receptacles.

15. The method of claim 14, wherein the test load is applied for a period of time during which the first electrical device monitors the current in each branch circuit breaker successively, thereby determining the circuit breaker through which the test load current is flowing.

16. The method of claim 15, wherein the current flowing through each circuit breaker is measured by measuring the voltage across the circuit breaker.

17. The method of claim 16, wherein contact is made with each circuit breaker, to measure the voltage across it, by using a magnetic probe that sticks to a wire-retaining steel screw in the circuit breaker.

18. The method of claim 13 wherein a portable computer is programmed so as to allow an electrician to exercise control of the system, by selecting the tests to be performed, and to view the results of the measurements and calculations performed accordingly.

19. The method of claim 18 wherein the portable computer uses the measurements to calculate the length and resistance of each wire tested, from the point of test to the load center, and from these parameters estimate the gauge of the wire.

20. The method of claim 18 wherein the portable computer uses the measurements and calculations to construct a label for the load center, the label listing the number, type and location of receptacles and lights on each branch circuit.

21. The method of claim 18 wherein the portable computer uses the measurements and calculations to construct a schematic diagram of the electrical power distribution system.

22. The method of claim 18 wherein the portable computer saves the measurements into data tables and records these tables onto a non-volatile medium.

23. The method of claim 13 further comprising circuits for monitoring high-frequency noise characteristic of electrical arcing while the electrician provides a stimulus to generate arcing, selected from the group of switching switches, physically tapping fixtures, turning ON or OFF appliances, or conducting load tests.

24. The method of claim 13, wherein the second portable electrical device applies a test load between a branch conductor at the receptacle and ground at the load center, the return path being through the umbilical conductor, to produce a non-canceling magnetic field around the branch conductor for the purpose of tracing said branch conductor.

25. The method of claim 24, wherein the electrician uses a third portable electrical device, the device being capable of sensing the strength and direction of the magnetic field in synchronization with the application of the test load, to locate the branch conductor.

26. The method of claim 25, wherein the portable electrical device senses the magnitude and direction of the magnetic field in two dimensions and provides a display responsive to the direction for the purpose of locating the conductor.

27. The method of claim 25, wherein the portable electrical device senses the magnitude and direction of the magnetic field in three dimensions and provides a display responsive to the direction for the purpose of locating the conductor.

* * * * *